United States Patent
Matsuura et al.

(10) Patent No.: US 6,784,817 B2
(45) Date of Patent: Aug. 31, 2004

(54) DATA GENERATING METHOD, DATA GENERATOR, AND TRANSMITTER USING THE SAME

(75) Inventors: Toru Matsuura, Osaka (JP); Hisashi Adachi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/460,036

(22) Filed: Jun. 11, 2003

(65) Prior Publication Data

US 2004/0037369 A1 Feb. 26, 2004

(30) Foreign Application Priority Data

Jun. 13, 2002 (JP) ........................................ 2002-173356

(51) Int. Cl.[7] .............................................. H03M 3/00
(52) U.S. Cl. ........................ 341/143; 341/144; 375/289; 375/300; 375/302
(58) Field of Search ............................ 341/143, 144, 341/145, 200; 375/295, 261, 268, 271, 298, 300, 302, 297

(56) References Cited

U.S. PATENT DOCUMENTS 5,534,828 A * 7/1996 Okada et al. ................ 332/103
6,009,073 A * 12/1999 Kaneko ....................... 370/203
6,400,774 B1 * 6/2002 Matsuoka et al. .......... 375/295
2002/0085647 A1 * 7/2002 Oishi et al. ................. 375/297

FOREIGN PATENT DOCUMENTS

JP  2002-325109  11/2002

* cited by examiner

Primary Examiner—Brian Young
Assistant Examiner—John B Nguyen
(74) Attorney, Agent, or Firm—Smith, Gambrell & Russell, LLP

(57) ABSTRACT

In the prior art, it has been difficult to provide a data generator and a data generating method which serve to implement an efficient transmitter, as well as a transmitter utilizing this data generator. The present invention provides a raw data generator that generates, from an inputted signal, an I signal and a Q signal which are orthogonal to each other and an amplitude component of a quadrature signal composed of the I and Q signals, a delta sigma modulator that delta-sigma-modulates the amplitude component, a first multiplier that outputs first data obtained by multiplexing normalized I data obtained by dividing the I signal by the amplitude component, by the delta-sigma-modulated signal, and a second multiplier that outputs second data obtained by multiplexing normalized Q data obtained by dividing the Q signal by the amplitude component, by the delta-sigma-modulated signal.

25 Claims, 31 Drawing Sheets

VECTOR DIAGRAM FOR DELTA-SIGMA-MODULATED
I AND Q DATA SHOWING ONLY FIRST 512 POINTS

DATA GENERATING METHOD, DATA GENERATOR, AND TRANSMITTER USING THE SAME

BACKGROUND OF THE INVENTION

1. Field of the Invention

The present invention relates to a data generator and a data generating method which utilize a quadrature signal composed of an I signal and a Q signal, and a transmitter utilizing this data generator.

2. Related. Art of the Invention

FIG. 25 shows an example of a conventional transmitter (for example, see Japanese Patent Laid-Open No. 2002-325109. The entire disclosure of the document are incorporated herein by reference in its entirety.). In FIG. 25, two output terminals of a data generator 5001 output I data (I signal) and Q data (Q signal) which are orthogonal to each other. These data are inputted to a modulator 5002 for modulation. A signal outputted from the modulator 5002 is amplified by an amplifier 5006. The amplified signal is then radiated from an antenna 5007.

However, in the transmitter shown in FIG. 25, the envelope of the signal outputted from the antenna 5007 varies markedly. The amplifier 5006 must be linear in order to prevent such a signal from being degraded in the transmitter. Ensuring the linearity of the amplifier 5006 causes the amplifier 5006 to consume more power.

In view of these problems, it is an object of the present invention to provide a data generator and a data generating method which serve to implement an efficient transmitter, and a transmitter utilizing this data generator.

SUMMARY OF THE INVENTION

The $1^{st}$ aspect of the present invention is a data generating method comprising:

receiving an input signal to generate, from said signal, a quadrature signal composed of an I signal and a Q signal;

converting an amplitude component of said quadrature signal into a signal of a resolution lower than a resolution of said amplitude component;

dividing said I signal by the amplitude component of said quadrature signal to obtain normalized I data, multiplying said normalized I data by said converted signal to obtain first data, and outputting the first data; and dividing said Q signal by the amplitude component of said quadrature signal to obtain normalized Q data, multiplying said normalized Q data by said converted signal to obtain second data, and outputting the second data.

The $2^{nd}$ aspect of the present invention is a data generator comprising:

raw data generating means of generating, from an inputted signal, an I signal and a Q signal which are orthogonal to each other as well as an amplitude component of a quadrature signal composed of said I signal and said Q signal;

converting means of converting said amplitude component into a signal of a resolution lower than a resolution of said amplitude component;

first multiplying means of multiplying normalized I data obtained by dividing said I signal by the amplitude component, by said converted signal to obtain first data, and outputting the first data; and second multiplying means of multiplying normalized Q data obtained by dividing said Q signal by the amplitude component, by said converted signal to obtain second data, and outputting the second data.

The $3^{rd}$ aspect of the present invention is the data generator according to the $2^{nd}$ aspect, wherein said converting means is delta sigma modulating means.

The $4^{th}$ aspect of the present invention is the data generator according to the $3^{rd}$ aspect, wherein said raw data generating means outputs said I signal, said Q signal, and said amplitude component, wherein first dividing means connected to an output of said raw data generating means which outputs said amplitude component is connected to an output of said raw data generating means which outputs said I signal, and said first dividing means outputs said normalized I data by dividing said I signal by said amplitude component, wherein second dividing means connected to the output of said raw data generating means which outputs said amplitude component is connected to an output of said raw data generating means which outputs said Q signal, and said second dividing means outputs said normalized Q data by dividing said Q signal by said amplitude component, wherein said delta sigma modulating means is connected to the output of said raw data generating means which outputs the amplitude component, wherein said delta sigma modulating means outputs a signal obtained by delta-sigma-modulating said amplitude signal, wherein first multiplying means connected to an output of said delta sigma modulating means is connected to an output of said first dividing means, and said first multiplying means multiplies said normalized I data by the signal obtained by delta-sigma-modulating said amplitude signal, to obtain first data, and outputs the first data, and wherein second multiplying means connected to the output of said delta sigma modulating means is connected to an output of said second dividing means, and said second multiplying means multiplies said normalized Q data by the signal obtained by delta-sigma-modulating said amplitude signal, to obtain second data, and outputs the second data.

The $5^{th}$ aspect of the present invention is the data generator according to the $2^{nd}$ aspect, wherein said raw data generating means outputs the normalized I data obtained by dividing said I signal by the amplitude component of said quadrature signal, the normalized Q data obtained by dividing said Q signal by the amplitude component of said quadrature signal, and the amplitude component of said quadrature signal.

The $6^{th}$ aspect of the present invention is the data generator according to the $5^{th}$ aspect, wherein said converting means is delta sigma modulating means.

The $7^{th}$ aspect of the data generator according to the $2^{nd}$ or $5^{th}$ aspect, further comprising a fourth D/A converter and a fifth D/A converter which subject the first data and second data, respectively, outputted by said data generator, to D/A conversion.

The $8^{th}$ aspect of the present invention is the data generator according to the $6^{th}$ aspect, further comprising:

a first D/A converter connected to the output of said raw data generating means which outputs the normalized I data, of converting said normalized I data into analog data;

a second D/A converter connected to the output of said raw data generating means which outputs the normalized Q data, of converting said normalized Q data into analog data;

upsampling means connected to the output of said raw data generating means of upsampling the amplitude component of said quadrature signal; and a third D/A converter connected to the output of said delta sigma modulating means, of converting said delta-sigma-modulated signal, into analog signal, and wherein said delta sigma modulating means delta-sigma-modulates said upsampled signal, wherein said first multiplying means is connected to an output of said first D/A converter and an output of said third D/A converter to multiply said normalized I data converted into analog data by said delta-sigma-modulated signal converted into analog signal and then to output a result of the multiplication, wherein said second multiplying means is connected to an output of said second D/A converter and an output of said third D/A converter to multiply said normalized Q data converted into analog data by said delta-sigma-modulated signal converted into analog signal and then to output a result of the multiplication, and wherein said first D/A converter and said second D/A converter have a higher vertical resolution than said third D/A converter, and said third D/A converter operates at a higher speed than said first D/A converter and said second D/A converter.

The $9^{th}$ aspect of the present invention is the data generator according to the $2^{nd}$ aspect, further comprising first delay means of delaying said I signal and second delay means of delaying said Q signal.

The $10^{th}$ aspect of the present invention is the data generator according to the $2^{nd}$ aspect, further comprising third delay means of delaying said normalized I signal and fourth delay means of delaying-said normalized Q signal.

The $11^{th}$ aspect of the present invention is the data generator according to the $3^{rd}$ or $6^{th}$ aspect, wherein a low pass filter having a cutoff frequency higher than the half of a clock frequency of said delta sigma modulating means is connected to each of the outputs of said first multiplying means and said second multiplying means, to filter said first data and said second data.

The $12^{th}$ aspect of the present invention is the data generator according to the $3^{rd}$ or $6^{th}$ aspect, wherein said delta-sigma-modulated signal is composed of data sequence of real numbers with two values having the same magnitude and different signs.

The $13^{th}$ aspect of the present invention is the data generator according to the $3^{rd}$ or $6^{th}$ aspect, wherein said delta-sigma-modulated signal is composed of two values including 0 and a real number other than 0.

The $14^{th}$ aspect of the present invention is a data generator comprising:

raw data generating means of generating, from an inputted signal, an I signal and a Q signal which are orthogonal to each other as well as an amplitude component of a quadrature signal composed of said I signal and said Q signal, and outputting normalized I data obtained by dividing said I signal by the amplitude component of said quadrature signal, normalized Q data obtained by dividing said Q signal by the amplitude component of said quadrature signal, and a signal which is obtained by converting a signal obtained from the amplitude component of said quadrature signal and which has a lower resolution than said amplitude component;

angle modulating means of angle-modulating said normalized I data and said normalized Q data to output said angle-modulated signal; and amplitude modulating means of amplitude-modulating the angle-modulated signal outputted from said angle modulating means, using a signal obtained by converting amplitude data outputted by said raw data generating means.

The $15^{th}$ aspect of the present invention is a transmitter comprising:

a data generator according to the $2^{nd}$ or $5^{th}$ aspect; and vector modulating means of vector-modulating first data and second data outputted by said data generator.

The $16^{th}$ aspect of the present invention is the transmitter according to the $15^{th}$ aspect, wherein amplifying means is connected to an output of said modulating means, of amplifying said modulated signal, wherein band pass means is connected to an output of said amplifying means, of passing a particular band of said amplified signal, and wherein an antenna is connected to an output of said band pass means, for transmitting said passed band of the signal.

The $17^{th}$ aspect of the present invention is the transmitter according to the $16^{th}$ aspect, wherein an isolator is provided between said amplifying means and said band pass means.

The $18^{th}$ aspect of the present invention is a transmitter comprising:

a data generator according to the $2^{nd}$ or $5^{th}$ aspect;

first vector modulating means of vector-modulating said first data and said second data;

second vector modulating means of vector-modulating said I signal and said Q signal; and amplifying means of amplifying said vector-modulated signal, and wherein when the transmitted signal has an intensity larger than a predetermined amount, the signal vector-modulated by said first vector modulating means is inputted to said amplifying means for amplification, and when the transmitted signal has an intensity smaller than the predetermined amount, the signal vector-modulated by said second vector modulating means is inputted to said amplifying means for amplification.

The $19^{th}$ aspect of the present invention is a transmitter comprising:

a data generator according to the $2^{nd}$ or $5^{th}$ aspect;

third vector modulating means of vector-modulating said first data and said second data or said I signal and said Q signal; and amplifying means of amplifying the signal vector-modulated by said third vector modulating means, and wherein when the transmitted signal has an intensity larger than a predetermined amount, said third vector modulating means modulates said first data and said second data, and when the transmitted signal has an intensity smaller than the predetermined amount, said third vector modulating means modulates said I signal and said Q signal.

The $20^{th}$ aspect of the present invention is a transmitter comprising a data generator according to the $2^{nd}$ or $5^{th}$ aspect; and modulating means of modulating first data and second data outputted from said data generator, wherein amplifying means is connected to an output of said modulating means, of amplifying said modulated signal, wherein band pass means is connected to an output of said amplifying means, of passing a particular band of said amplified signal, and wherein an antenna is connected to an output of said band pass means, for transmitting said passed band of the signal.

The 21$^{st}$ aspect of the present invention is the transmitter according to the 20$^{th}$ aspect, wherein said converting means is delta sigma modulating means, a signal outputted from said delta sigma modulating means has multiple values, and a predistorted signal to compensate for non-linearity of said amplifying means is inputted to said amplifying means.

The 22$^{nd}$ aspect of the present invention is the transmitter according to the 20$^{th}$ aspect, wherein a signal outputted from said delta sigma modulating means has multiple values, said amplifying means is composed of a plurality of amplifiers connected in parallel, and at least one of said plurality of amplifiers is selected in accordance with an envelope of the signal outputted from said delta sigma modulating means.

The 23$^{rd}$ aspect of the present invention is the transmitter according to the 15$^{th}$ aspect, wherein a process ending with an output from said modulating means comprises a digital signal process.

The 24$^{th}$ aspect of the present invention is a transmitter comprising:

a data generator according to the 2$^{nd}$ or 5$^{th}$ aspect;

first vector modulating means connected to an output of said data generator, of vector-modulating first data and second data outputted from said data generator;

first amplifying means connected to an output of said first modulating means, of amplifying a signal outputted from said first modulating means;

quantization noise generating means connected to said data generator, of outputting first quantization noise data generated by subtracting said I signal from said first data and second quantization noise data generated by subtracting said Q signal from said second data;

fourth vector modulating means connected to an output of said quantization noise generating means, of vector-modulating said first quantization noise data and said second quantization noise data;

second amplifying means connected to an output of said fourth vector modulating means, of amplifying a signal outputted from said fourth vector modulating means; and combining means connected to an output of said first amplifying means and to an output of said second amplifying means, of combining the signal outputted from said first amplifying means and the signal outputted from said second amplifying means in substantially same amplitude and opposite phases, to cancel a quantization noise component.

The 25$^{th}$ aspect of the present invention is the transmitter according to the 24$^{th}$ aspect, wherein a low pass filter is connected to an output of said quantization noise generating means.

Figure 1:
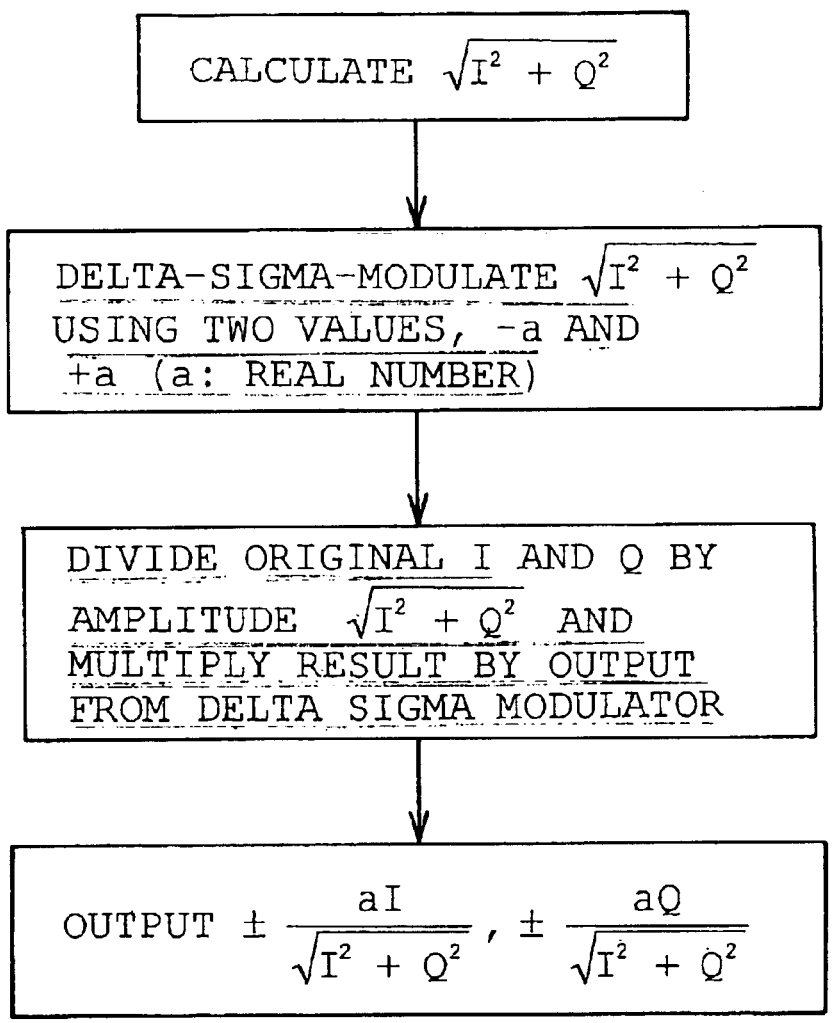
FIG. 1 is a diagram illustrating operations of a data generator according to Embodiment 1 of the present invention.

Description of Symbols
201 Raw data generator
301 Raw data generator
302, 303 Divider
304 Delta sigma modulator
305, 306 Multiplier
307, 308 Output terminal
402, 403 Low pass filter
404, 405 Output terminal
501 Data generator
502 Vector modulator
503 Amplifier
504 Band pass filter
505 Antenna
601 Data generator
602 Vector modulator
603 Multiplier
604 Signal generator
605 Band pass filter
606 Amplifier
607 Band pass filter
608 Antenna
701 Data generator
702, 703 Multiplier
704 Phase shifter
705 Signal generator
706 Combiner
707 Output terminal
708 Digital signal processing section
801 Input terminal
802, 804, 806, 808 Subtractor
803, 805, 807, 809 Integrator
811, 812, 813, 814 Amplifier
810 Quantizer
815 Output terminal
902 Phase detecting section
903 Voltage control oscillator
904 Frequency control section
905 Amplifier
906 Band pass filter
907 Antenna
5001 Data generator
5002 Modulator
5003 Multiplier
5004 Signal generator
5005 Band pass filter
5006 Amplifier
5007 Antenna

PREFERRED EMBODIMENTS OF THE INVENTION (Embodiment 1)

Figure 11:
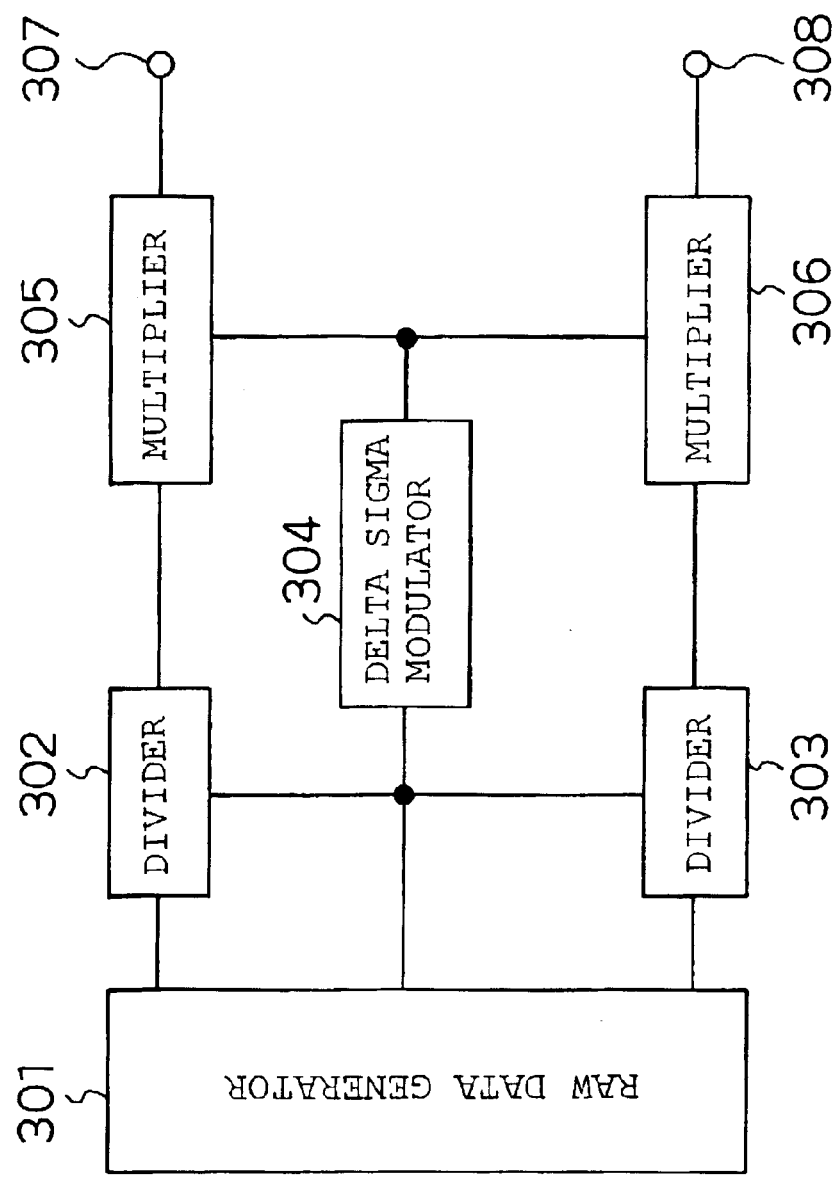
FIG. 11 is a block diagram showing a configuration of the transmitter according to Embodiment 2 according to the present invention.

With reference to FIG. 11, description will be given of a configuration of a data generator according to Embodiment 1 of the present invention.

A raw data generator 301 is an example of raw data generating means according to the present invention which generates, from an inputted signal, an I signal and a Q signal which are orthogonal to each other (that is the I signal and the Q signal compose a quadrature signal) as well as an amplitude signal $(I^2+Q^2)^{1/2}$. One input of a divider 302 as an example of first dividing means according to the present invention is connected to an output of the raw data generator 301 from which the I signal is outputted. One input of a divider 303 as an example of second dividing means according to the present invention is connected to an output of the raw data generator 301 from which the Q signal is outputted.

A delta sigma modulator 304 as an example of delta sigma modulating means according to the present invention is connected to an output of the raw data generator 301 from which the amplitude signal is outputted. Further, the amplitude signal output of the raw data generator 301 is also connected to the other input of the divider 302 and the other input of the divider 303.

An output of the divider 302 connects to one input of a multiplier 305 as an example of first multiplying means according to the present invention. An output of the divider 303 connects to one input of a multiplier 306 as an example of second multiplying means according to the present invention. Further, the other input of each of the multipliers 305 and 306 is connected to an output of the delta sigma modulator 304. Output terminals 307 and 308 are connected to outputs of the multipliers 305 and 306, respectively.

Now, description will be given of operations of the data generator configured as described above. FIG. 1 schematically shows the operations described below.

The amplitude signal $(I^2+Q^2)^{1/2}$ outputted from the raw data generator 301 is inputted to the delta sigma modulator 304. The delta sigma modulator 304 outputs either of two values including $-a$ and $+a$ (a: a positive real number) (that is, two values having the same magnitude and different signs), as a delta sigma modulation signal.

On the other hand, the I signal generated by the raw data generator 301 is inputted to the divider 302 and divided by the amplitude signal inputted from the other input of the divider 302 to obtain normalized I data $(I/(I^2+Q^2)^{1/2})$. The normalized I data is outputted from the divider 302 and is then inputted to the multiplier 305. The normalized I data inputted to the multiplier 305 is multiplied by the delta-sigma-modulated signal ($\pm a$) inputted from the other input of the multiplier 305 to obtain first data $(\pm aI/(I^2+Q^2)^{1/2})$. The first data obtained is outputted from the multiplier 305 via the output terminal 307.

Further, the Q signal generated by the raw data generator 301 is inputted to the divider 303. As described above, the normalized Q data $(I^2+Q^2)^{1/2}$ is outputted from the divider 303 and is then multiplied by the delta-sigma-modulated signal ($\pm a$) to obtain second data $(\pm aQ/(I^2+Q^2)^{1/2})$. The second data is outputted from the multiplier 306 via the output terminal 308.

The first and second data obtained as described above are quadrature modulated to obtain a signal with a constant envelope. Specific description will be given of an example in which π/4 shift QPSK is used as a modulation method for a signal inputted to the raw data generator 301. A symbol rate is assumed to be 21 kHz.

Figure 2:
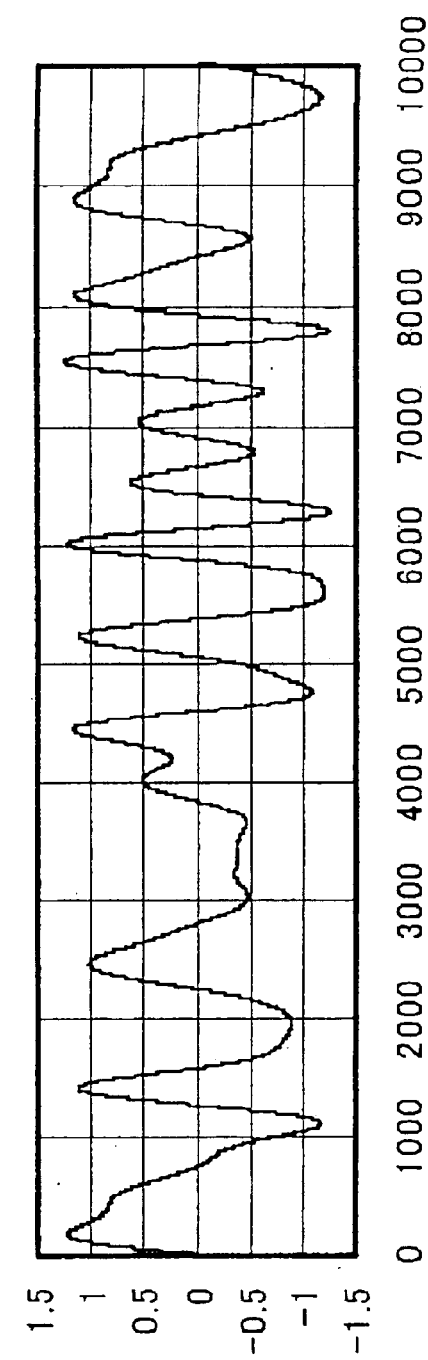
FIG. 2 is a diagram illustrating operations of the data generator according to Embodiment 1 of the present invention.
Figure 3:
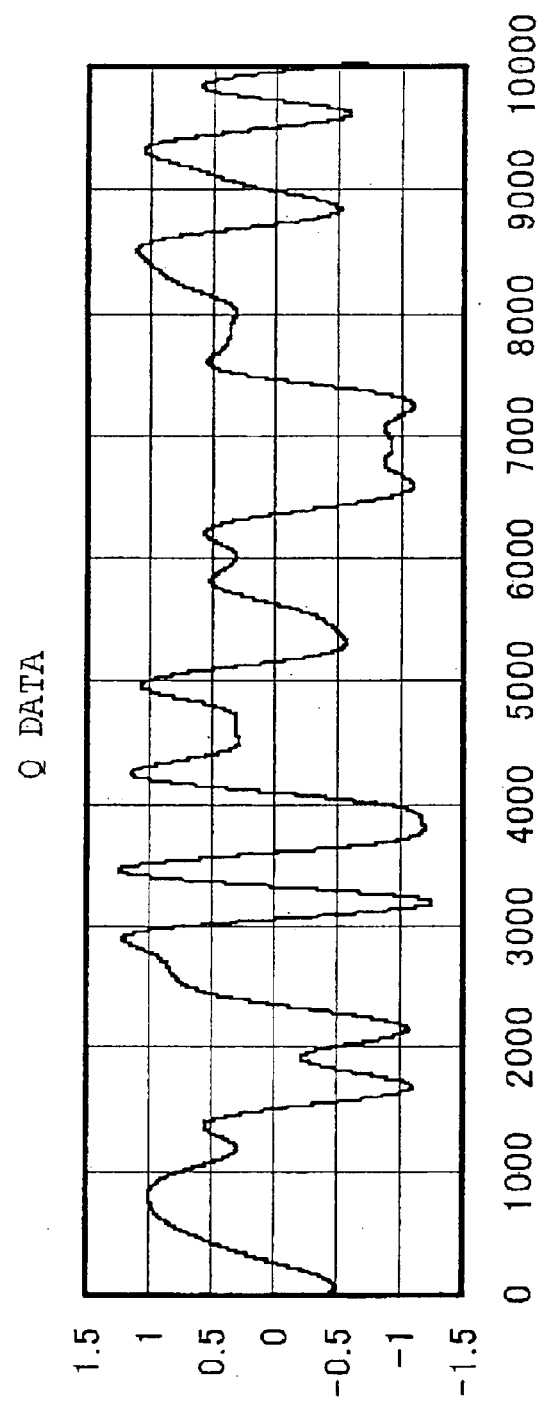
FIG. 3 is a diagram illustrating operations of the data generator according to Embodiment 1 of the present invention.
Figure 4:
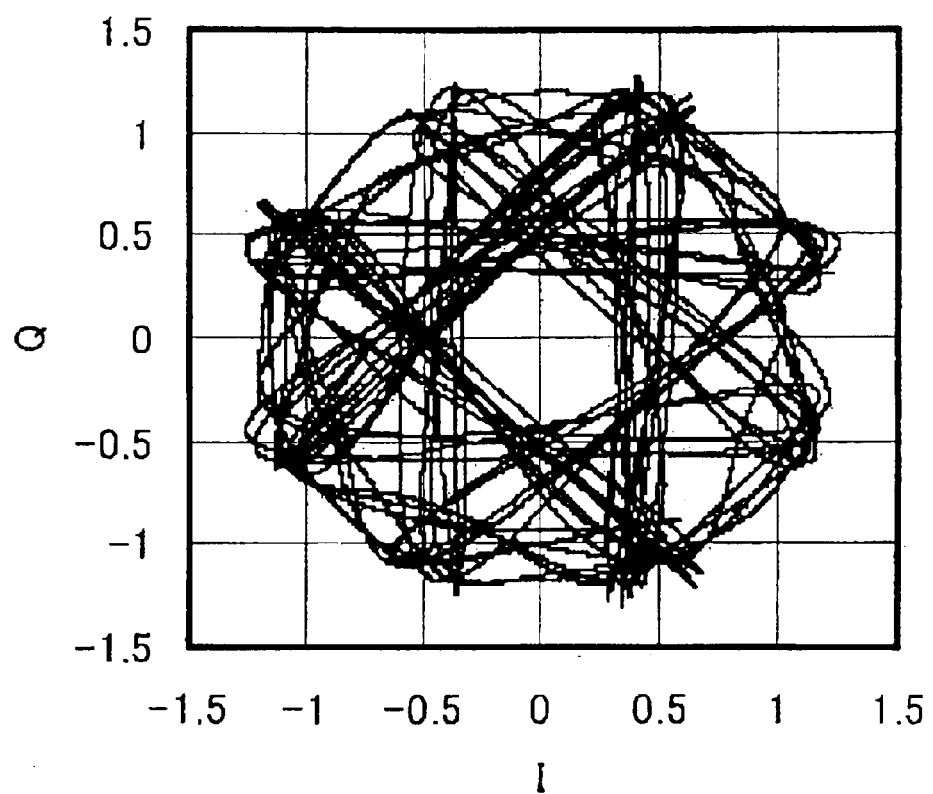
FIG. 4 is a diagram illustrating operations of the data generator according to Embodiment 1 of the present invention.
Figure 5:
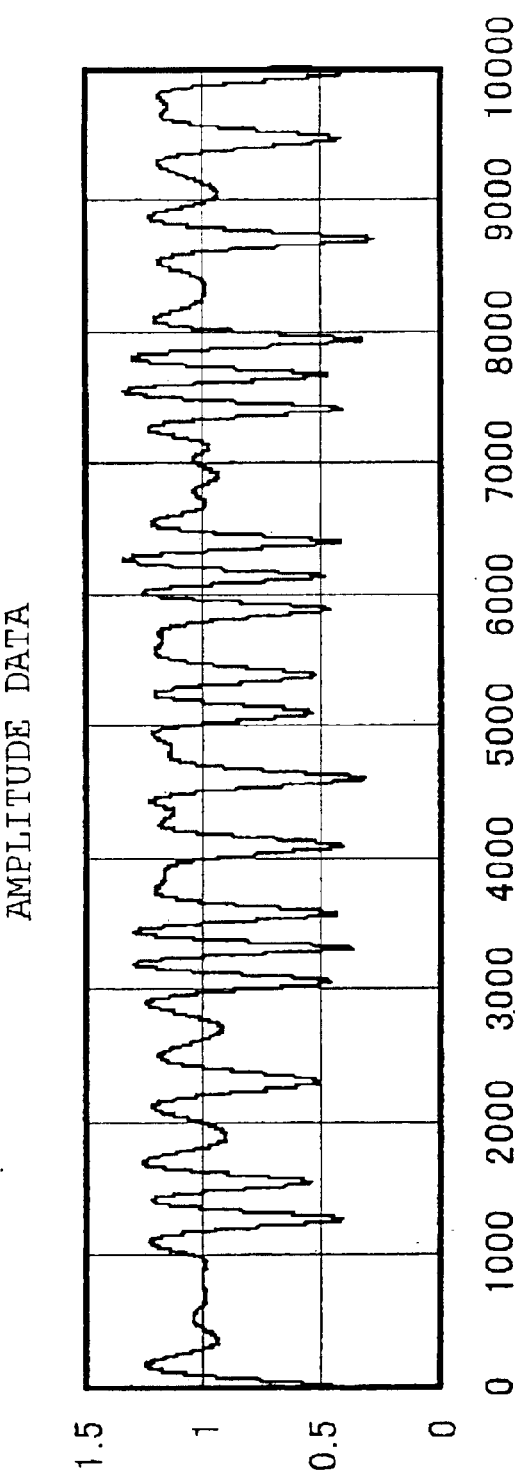
FIG. 5 is a diagram illustrating operations of the data generator according to Embodiment 1 of the present invention.

It is assumed that I data and Q data are provided as shown in FIGS. 2 and 3. FIG. 4 is a vector diagram representing the relationship between the I data and Q data. FIG. 5 shows the amplitude $(I^2+Q^2)^{1/2}$ of a quadrature signal calculated from the I data and Q data. The amplitude signal obtained is then delta-sigma-modulated (that is quantized by delta-sigma-modulation) by the delta sigma modulator 304. In this case, the delta sigma modulator 304 has a clock frequency set at 5.376 MHz, which is 256 times as high as the symbol rate. It is further assumed that the delta sigma modulator 304 is of a first order and that the delta sigma modulator 304 outputs two values, −1.5 and +1.5. The signal outputted by the delta sigma modulator 304 is multiplied by the normalized I data and the normalized Q data to obtain first data and second data, respectively.

Figure 6:
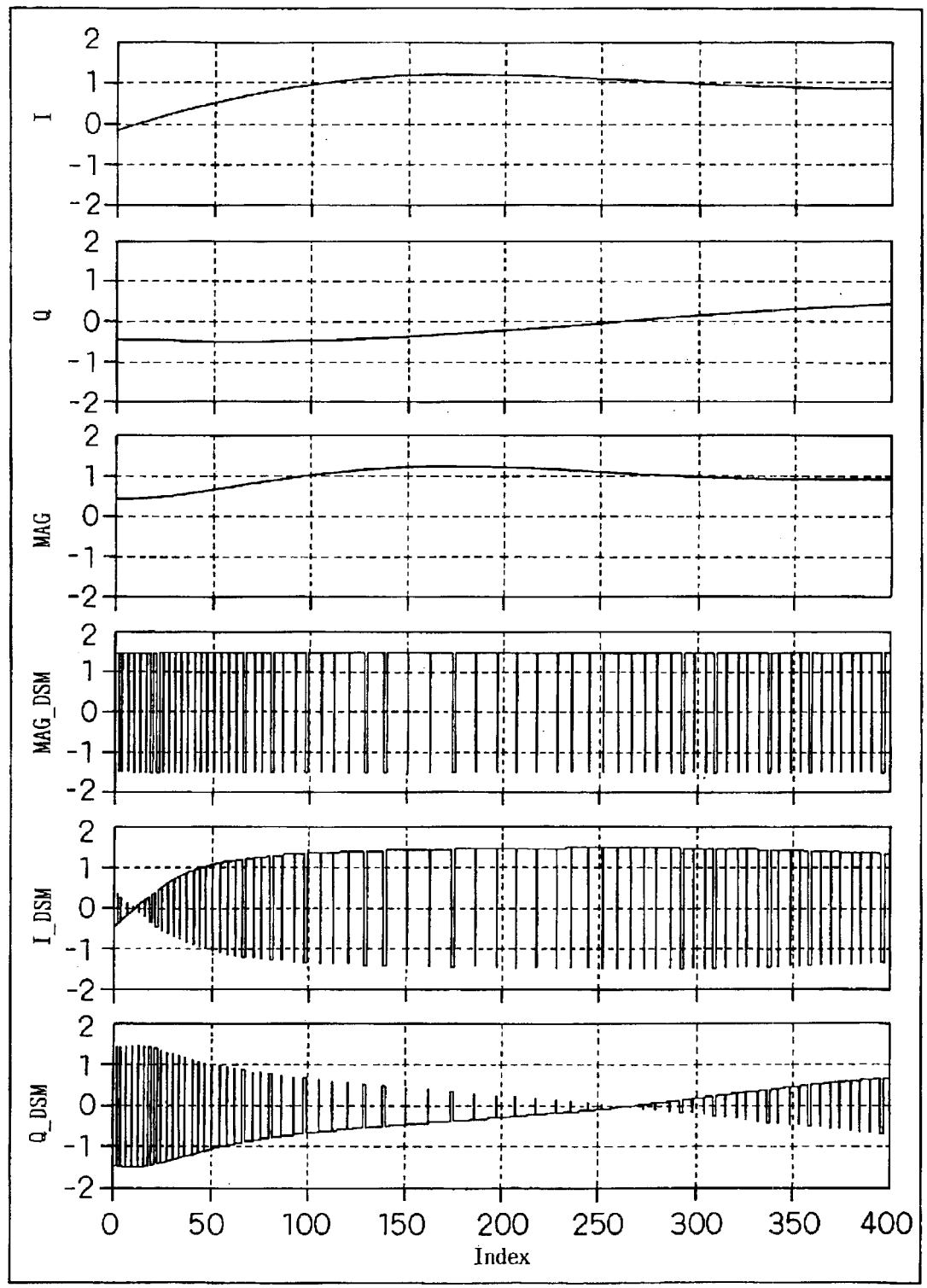
FIG. 6 is a diagram illustrating operations of the data generator according to Embodiment 1 of the present invention.
Figure 7:
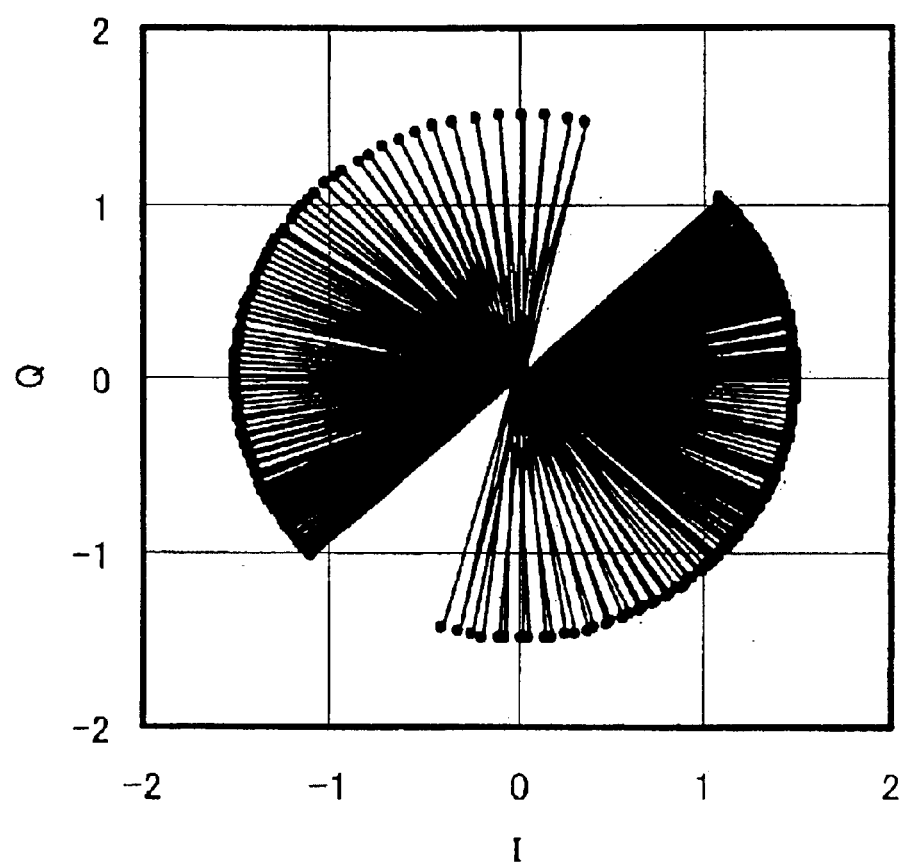
FIG. 7 is a diagram illustrating operations of the data generator according to Embodiment 1 of the present invention.

FIG. 6 shows I data (denoted as I), Q data (denoted as Q), amplitude data (denoted as MAG), an output from the delta sigma modulator 304 (MAG_DSM), and first data and second data (denoted as I_DSM and Q_DSM, respectively). This figure shows only first 400 data points. FIG. 7 is a vector diagram showing the relationship between the first data and the second data. This figure shows only first 512 data points but indicates that all the points are on the same circumference. That is, the amplitude component of a quadrature signal composed of the first and second data is a and has a fixed value. This means that the envelope of the signal quadrature modulated by the first and second data has a fixed value.

Figure 8:
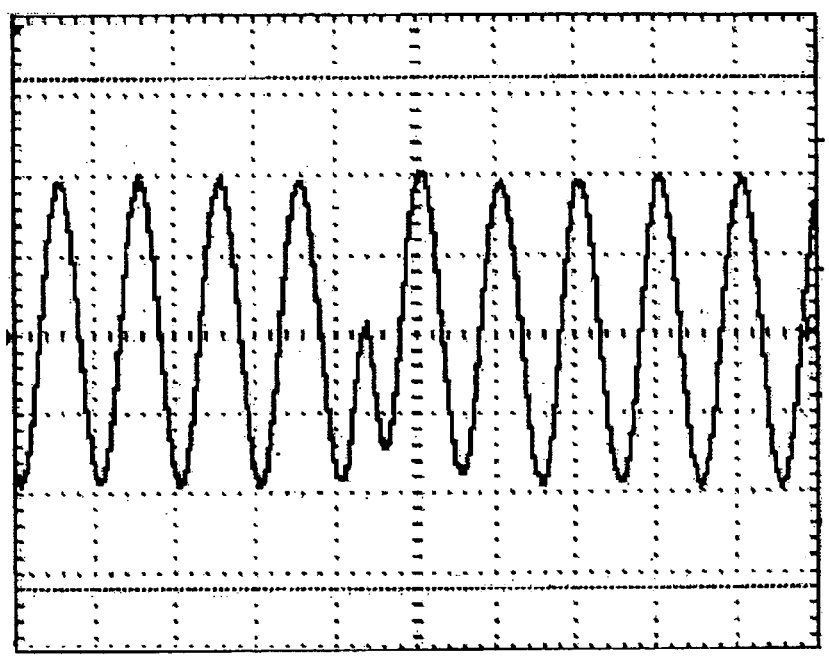
FIG. 8 is a diagram illustrating operations of the data generator according to Embodiment 1 of the present invention.
Figure 17:
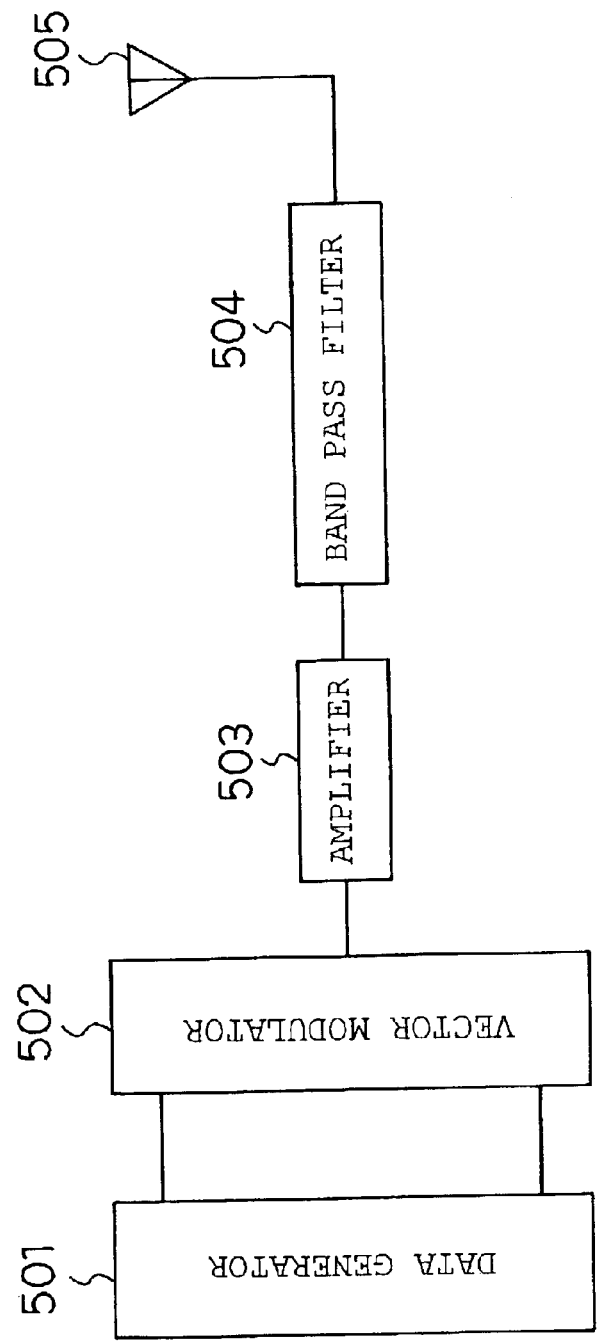
FIG. 17 is a block diagram showing a configuration of the transmitter according to Embodiment 2 according to the present invention.

If the above data generator is used to construct the transmitter shown in FIG. 17, the amplifier succeeding the data generator need not be linear. It is accordingly possible to realize a data generator and a data generating method which enable the implementation of an efficient transmitter with low power consumption. FIG. 8 shows a waveform obtained by measuring an output from a vector modulator 502 using an oscilloscope.

Figure 10:
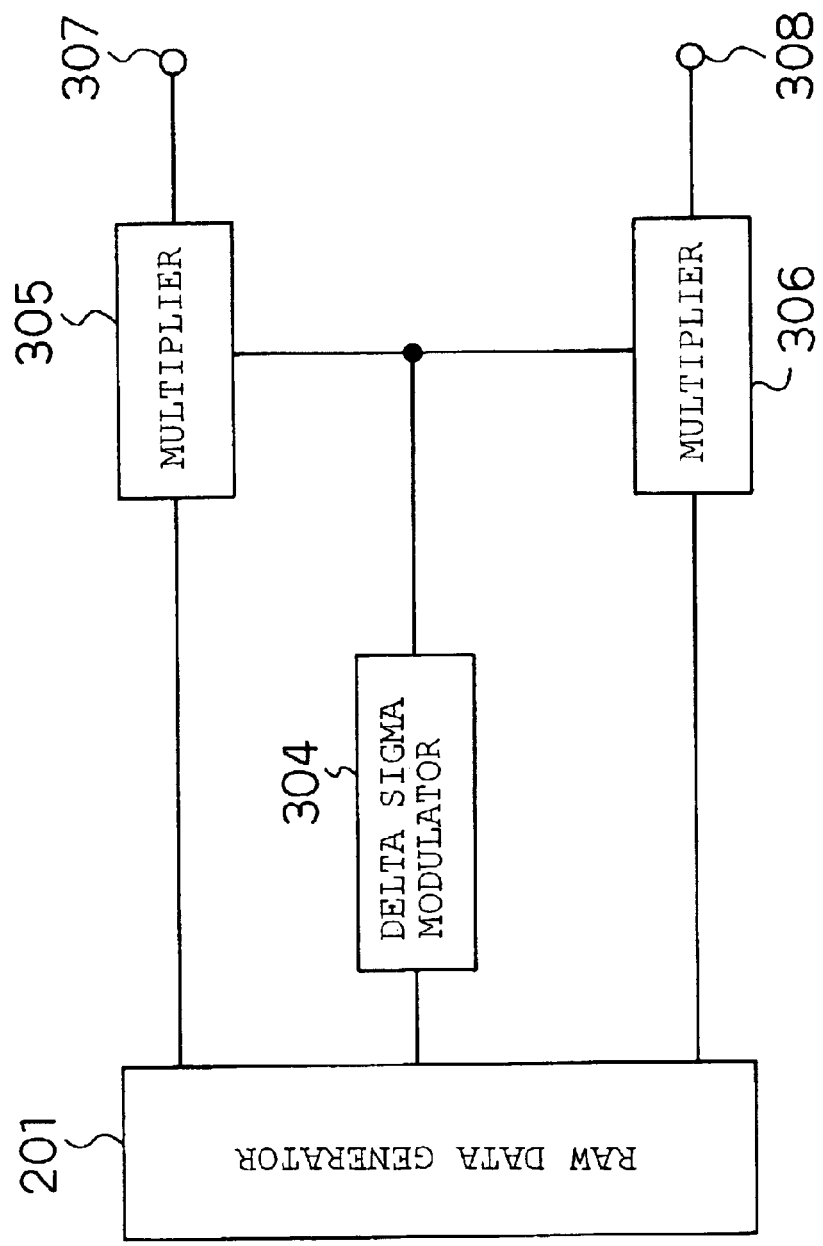
FIG. 10 is a block diagram showing a configuration of a transmitter according to Embodiment 2 according to the present invention.

In the above description, to determine normalized I and Q data, an I and Q signals outputted from the raw data generator 301 are divided by the dividers 302 and 303, respectively, connected externally to the raw data generator 301. However, it is contemplated that the dividers 302 and 303 may be constructed inside a raw data generator 201. In this case, the data generator is configured as shown in FIG. 10, wherein the raw data generator 201 outputs normalized I and Q data together with the amplitude signal. The other components are similar to those of the data generator in FIG. 11.

Figure 30:
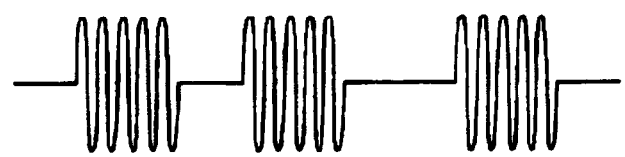
FIG. 30 is a diagram showing the characteristics of the data generator according to Embodiment 1 of the present invention.

Further, in the above description, the delta-sigma-modulated is binary and has a value of +a or −a. However, it is contemplated that this signal is binary and has a value of 0 or a real number other than 0. In this case, the signal composed of the first and second data is shown by turning on and off a signal with a constant envelope (as shown in FIG. 30). Accordingly, the amplifier succeeding the data generator need not be linear. Therefore, effects similar to those described above are obtained.

Figure 20:
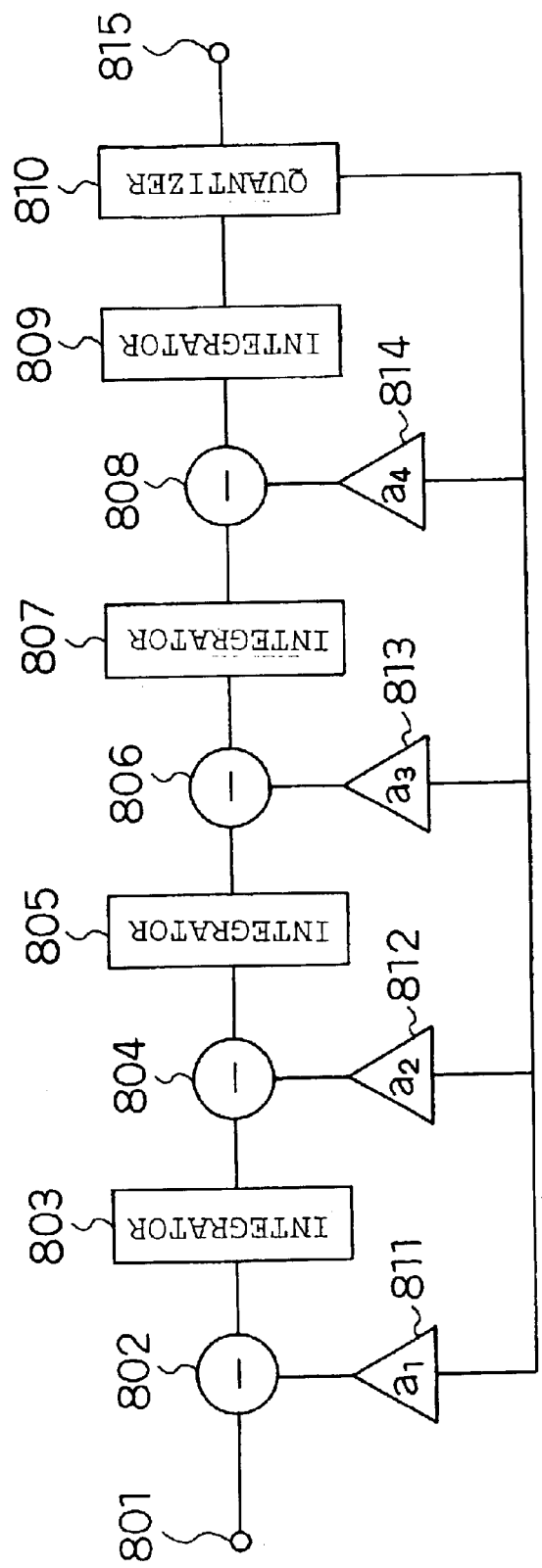
FIG. 20 is a block diagram showing an example of some components of the data generator according to Embodiment 1 of the present invention.

Further, in the above description, the delta sigma modulator 304 is of a first order. However, it may be of a higher order. FIG. 20 shows a configuration of a fourth-order delta sigma modulator. The use of such a higher-order delta sigma modulator enables a reduction in quantization noise near a desired wavelength.

(Embodiment 2)

Now, description will be given of the case in which a transmitter is constructed using a data generator outputting first and second data as described in Embodiment 1, described above. FIG. 17 shows a transmitter having such a configuration.

In the transmitter configured as shown in FIG. 17, a data generator 501 is as described in Embodiment 1. An output of the data generator 501 which outputs first and second data connects to a vector modulator 502 as an example of vector modulating means according to the present invention. An output of the vector modulator 502 connects to an amplifier 503 as an example of amplifying means of amplifying the modulated signal according to the present invention. An output of the amplifier 503 connects to a band pass filter 504 as an example of band pass means according to the present invention. An antenna 505 is connected to an output of the band pass filter 504.

Now, description will be given of this transmitter. First and second data outputted by the data generator 501 are inputted to the vector modulator 502, which then vector-modulates these data. A signal outputted from the vector modulator 502 is inputted to the amplifier 503. The amplifier 503 amplifies this signal to a desired signal intensity. Then, a particular band of a signal outputted from the amplifier 503 passes through the band pass filter 504. The filtered signal is then transmitted from the antenna 505.

Figure 9:
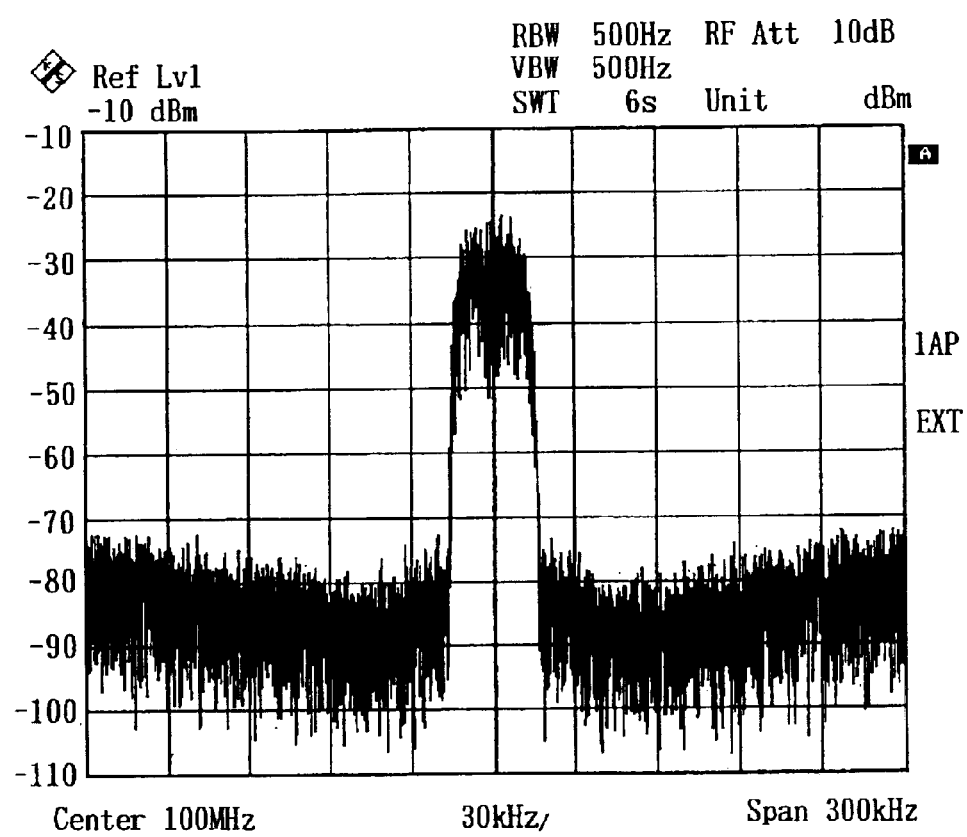
FIG. 9 is a diagram illustrating operations of the data generator according to Embodiment 1 of the present invention.

FIGS. 8 and 9 show the temporal waveform (measured values) and frequency spectrum (measured values), respectively, of an output from the vector modulator 502. FIG. 8 indicates that an output signal from the vector modulator 502 has a constant envelope. FIG. 9 indicates that the vector modulator 502 provides a desired frequency spectrum.

As described above, a signal obtained by modulating an output from the data generator has a constant envelope, i.e. an envelope that does not vary. Accordingly, the multiplier and amplifier succeeding the data generator need not be linear. This makes it possible to realize an efficient transmission circuit.

In the above description of the present embodiment, a signal generated by the data generator 501 is modulated and amplified before being transmitted from the antenna 505. However, a signal generated by the data generator 501 may be modulated and then up-converted before being amplified and transmitted. In this case, the transmitter is configured, for example, as shown in FIG. 18.

Figure 18:
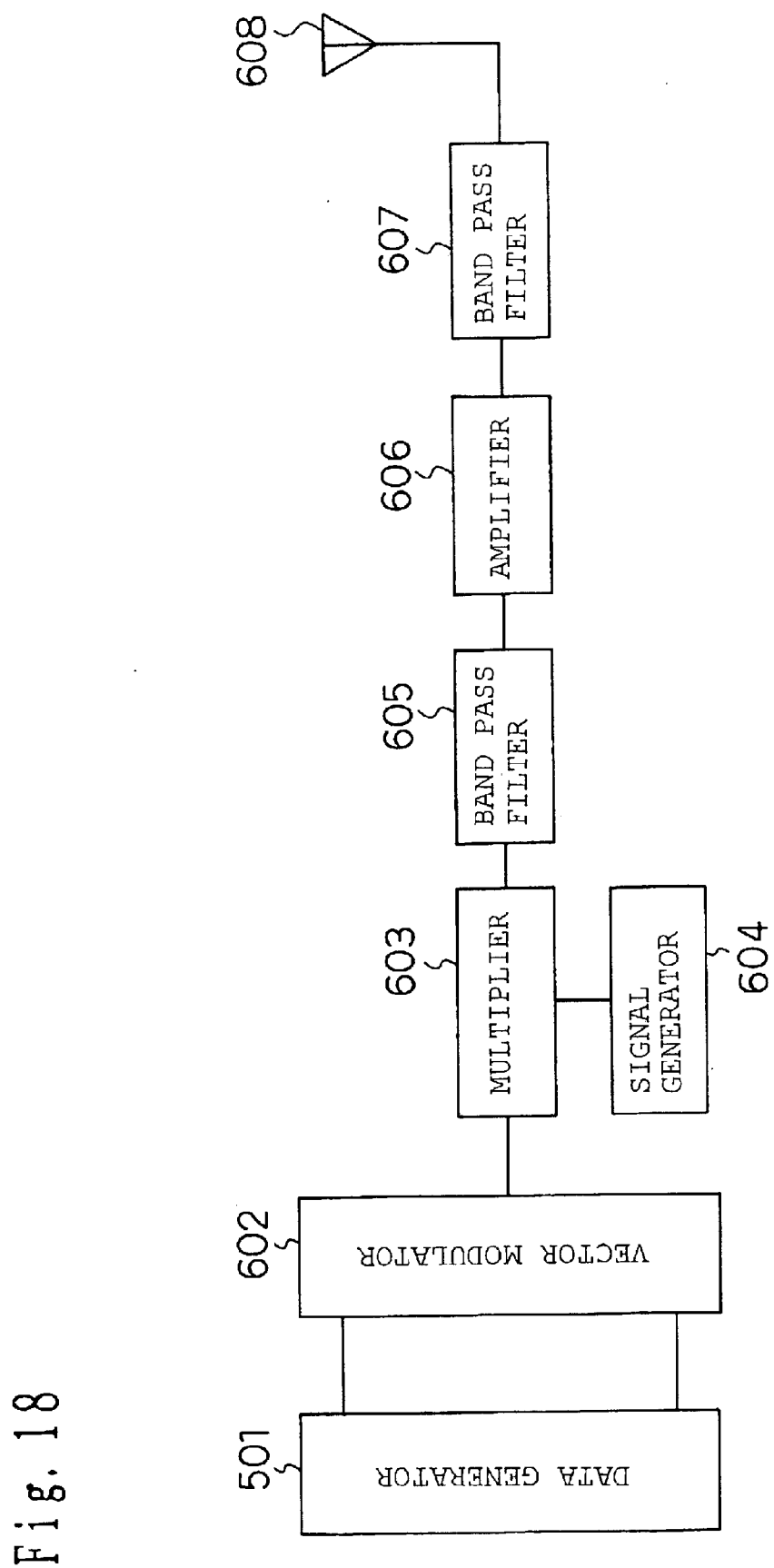
FIG. 18 is a block diagram showing a configuration of another example of the transmitter according to Embodiment 2 according to the present invention.

In the configuration of the transmitter shown in FIG. 18, one input of a multiplier 603 is connected to a vector modulator 602. An output of a signal generator 604 is connected to the other input of the multiplier 603. A band pass filter 605 is connected to an output of the multiplier 603. An input of an amplifier 606 is connected to an output of the band pass filter 605. The amplifier 606, band pass filter 607, and antenna 608 correspond to and operate similarly to the amplifier 503, band pass filter 504, and antenna 505, shown in FIG. 17.

With this arrangement, a signal outputted from the vector modulator 602 is multiplied by a signal generated by the signal generator 604. A part of the multiplied signal which has been subjected to the desired up converted signal passes through the band pass filter 605 and is then inputted to the amplifier 606. Even with these arrangements and operations, effects similar to those described above can be produced.

Figure 31:
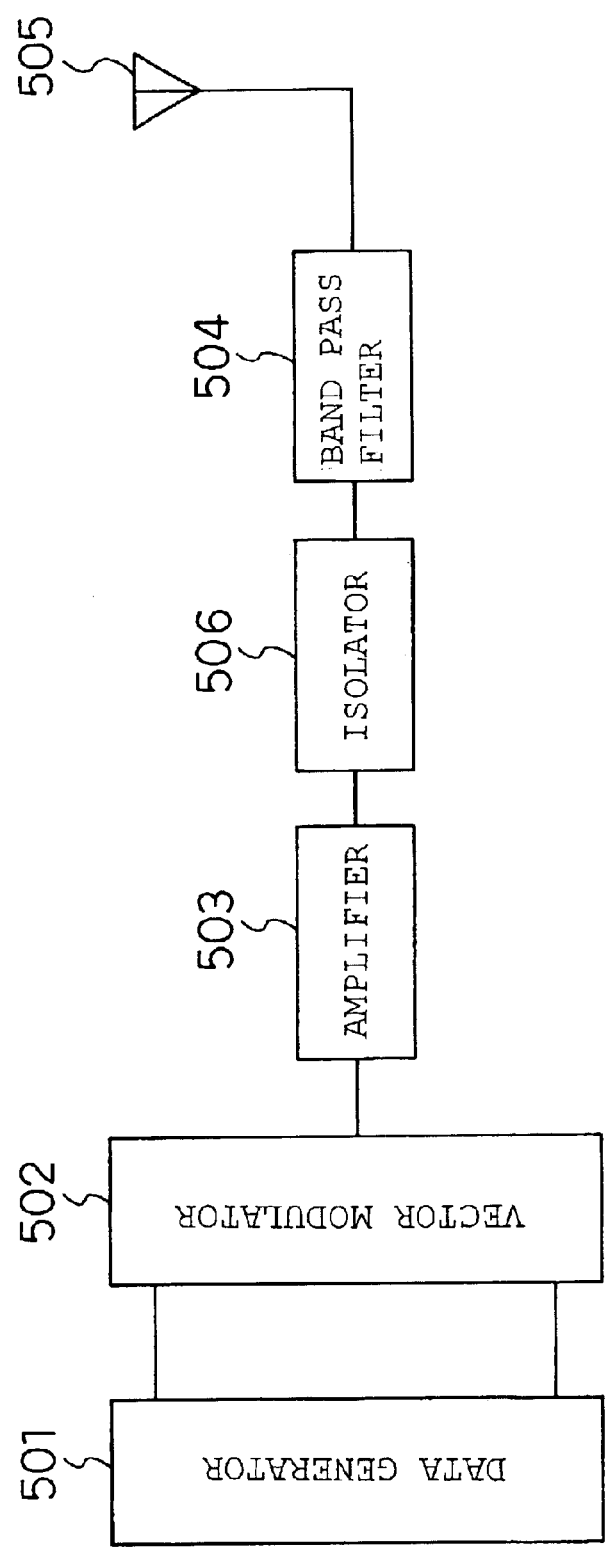
FIG. 31 is a block diagram showing an example of a configuration of a transmitter according to Embodiment 2 of the present invention.

Further, as shown in FIG. 31, it is contemplated that an isolator 506 is interposed between the amplifier 503 and the band pass filter 504. The interposition of the isolator 506 serves to accomplish a fixed load impedance over a wide range of frequencies without causing any unwanted distortion in the amplifier 503.

Figure 12:
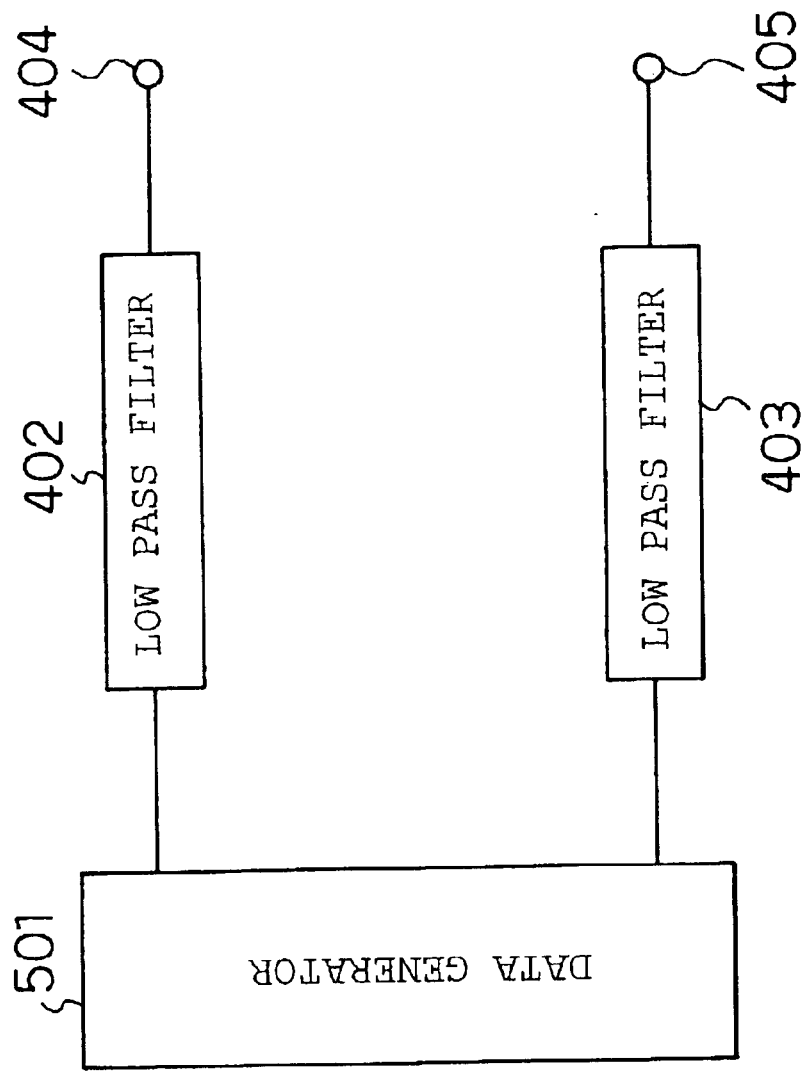
FIG. 12 is a block diagram showing a part of a configuration of the transmitter according to Embodiment 2 according to the present invention.

Further, in the description of the present embodiment, an output from the data generator 501 is directly vector-modulated. However, it is contemplated that an output from the data generator 501 may be modulated using a low pass filter. FIG. 12 shows such a configuration of a data generator. In the data generator shown in FIG. 12, low pass filters 402 and 403 are connected to a first and second data outputs, respectively, of the data generator 501. The devices succeeding the data generator 501 need not be linear with respect to an output signal from the data generator 501, provided that the cutoff frequencies of the low pass filters 402 and 403 are each higher than the half of the clock frequency of the delta sigma modulator 304 inside the data generator 501. This is because the data during clocking has only to be amplified and transmitted and has a fixed value.

Figure 13:
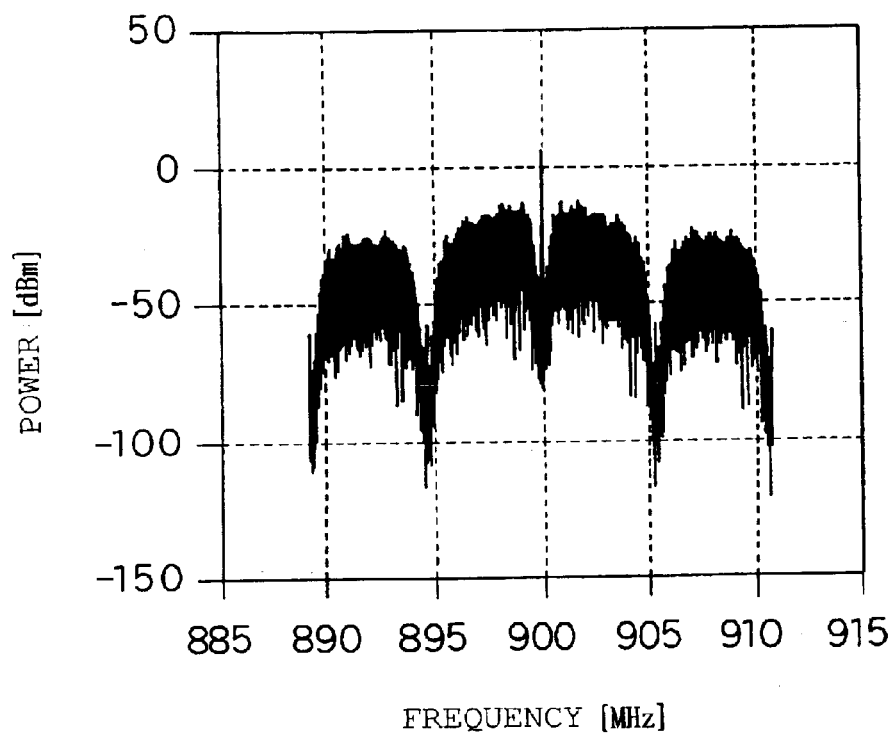
FIG. 13 is a diagram showing the characteristics of the transmitter according to Embodiment 2 according to the present invention.
Figure 14:
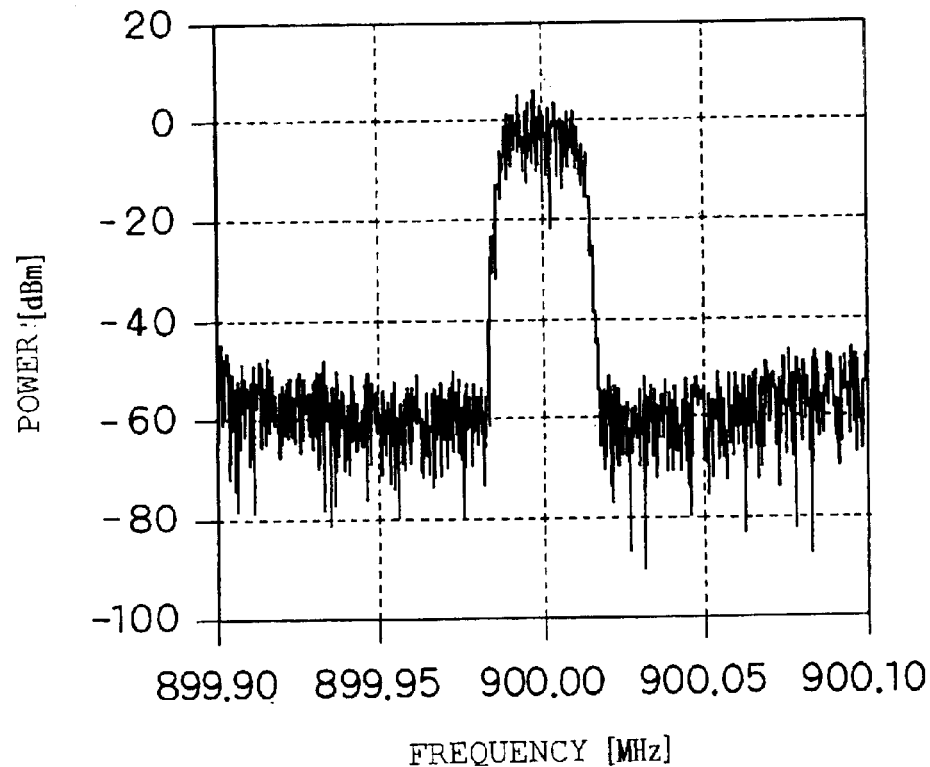
FIG. 14 is a diagram showing the characteristics of the transmitter according to Embodiment 2 according to the present invention.
Figure 15:
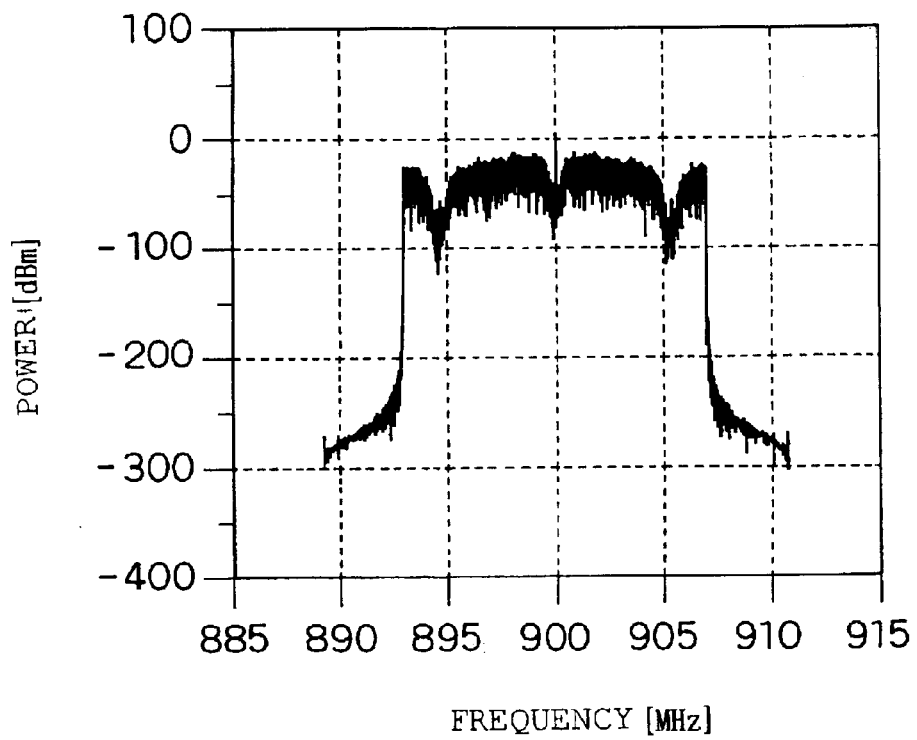
FIG. 15 is a diagram showing the characteristics of the transmitter according to Embodiment 2 according to the present invention.
Figure 16:
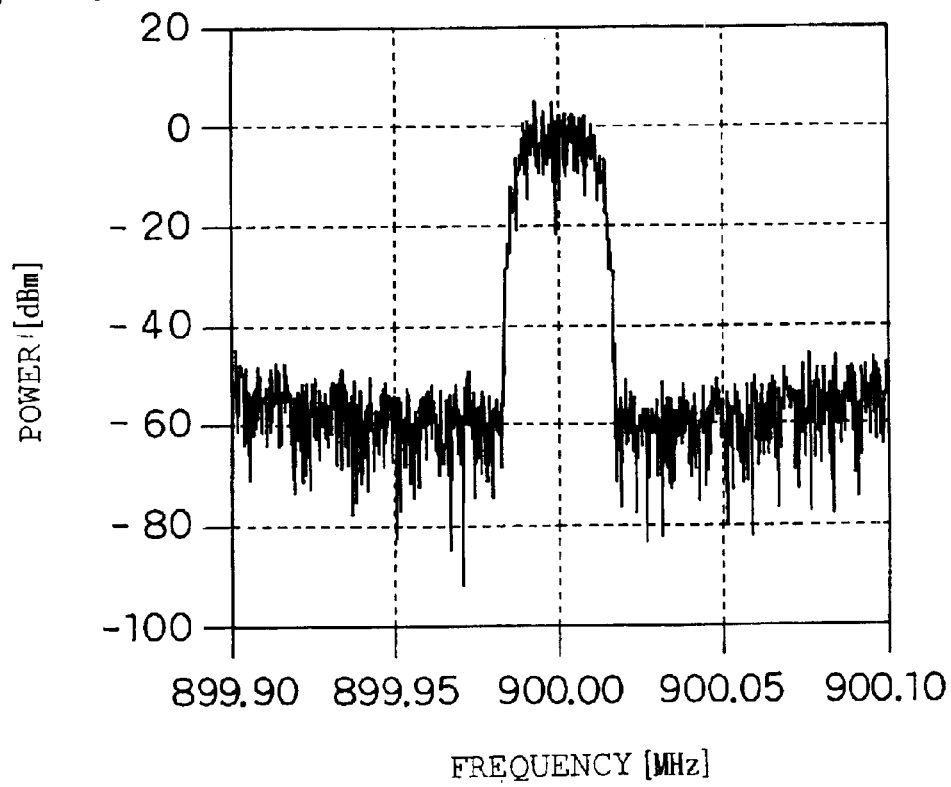
FIG. 16 is a diagram showing the characteristics of the transmitter according to Embodiment 2 according to the present invention.

FIGS. 15 and 16 show spectrum wave forms obtained if raised cosine type digital low pass filters are employed as the low pass filters 402 and 403. In this case, the cutoff frequency is 7 MHz, and a roll off factor $\alpha=0$. These figures indicate that signals of distant frequencies are suppressed, while the desired wave is not affected. For comparison, FIGS. 13 and 14 show spectra obtained if an output from the data generator 501 is directly quadrature modulated. In spite of the use of the same modulation wave as that in Embodiment 1, these figures indicate that quantization noise spreads over a wide band.

If such a data generator is used to construct the transmitter shown in FIG. 17 or 18, the low pass filters 402 and 403 remove part of the quantization noise. This moderates the requirements for the characteristics of the band pass filters 504 and 607.

Figure 19:
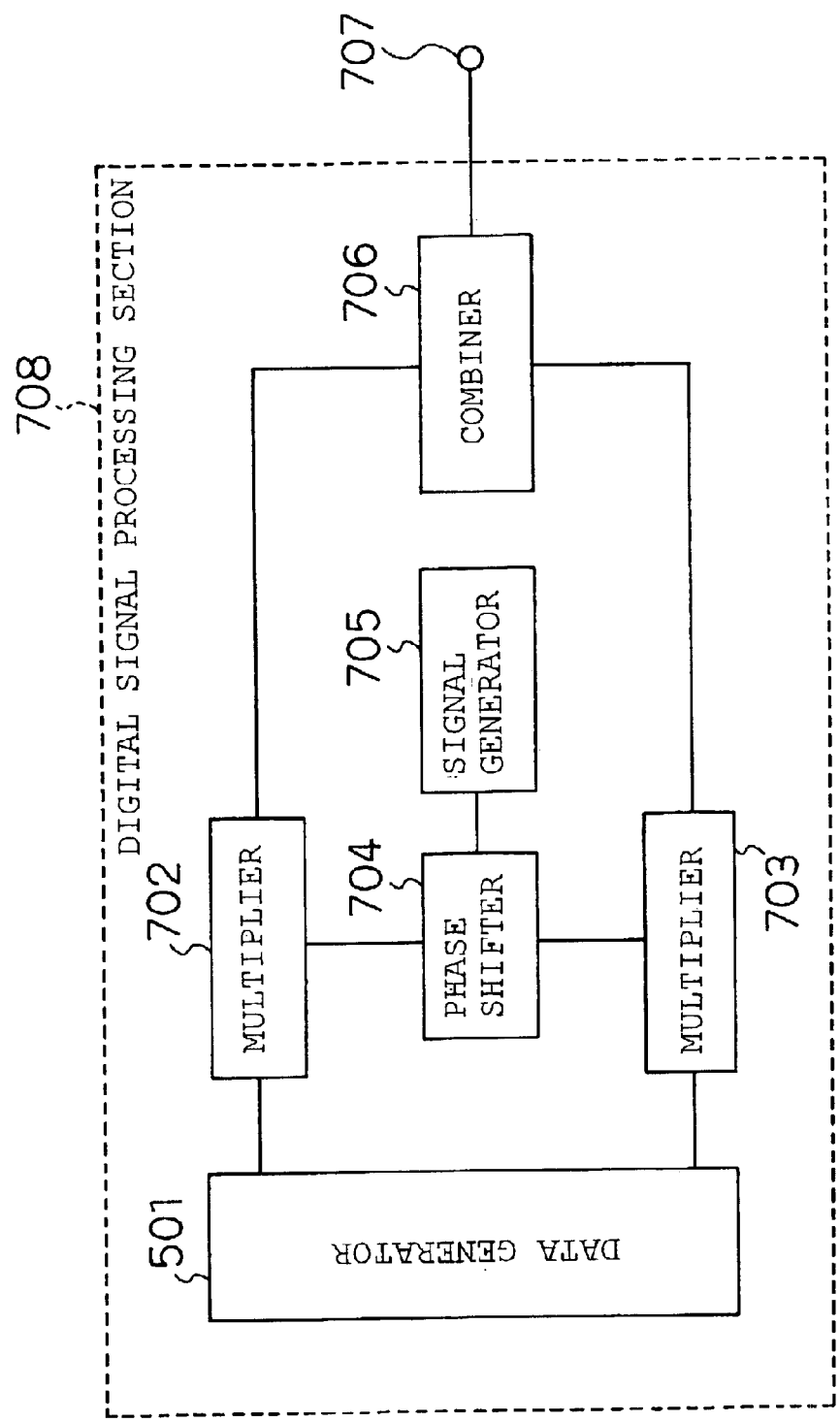
FIG. 19 is a block diagram showing a configuration of another example of the transmitter according to Embodiment 2 according to the present invention.

Further, in the transmitters in FIGS. 17 and 18 in the above description, the vector modulators 502 and 602 may have the same configuration of, for example, the quadrature modulator shown in FIG. 19.

Specifically, in the configuration shown in FIG. 19, the first and second data outputs of the data generator 501 are connected to a multiplier 702 as an example of third multiplying means according to the present invention and to a multiplier 703 as an example of fourth multiplying means according to the present invention. Both multipliers 702 and 703 connect to a phase shifter 704 as an example of phase shifting means according to the present invention. The phase shifter 704 connects to a signal generator 705 as an example of signal generating means according to the present invention. Further, outputs of the multipliers 702 and 703 are both connected to a combiner 706. An output of the combiner 706 is connected to an output terminal 707.

According to the quadrature modulator configured as described above, first and second data outputted from the data generator 501 are inputted to one of the inputs of each of the multipliers 702 and 703. A signal outputted by the signal generator 705 is inputted to the other input of each of the multipliers 702 and 703 via the phase shifter 704. Here, the phase shifter 704 adjusts the signals inputted to the multipliers 702 and 703 so that these signals have a phase difference of 90°. Outputs from the multipliers 702 and 703 are combined by the combiner 706. The combined data is outputted from the output terminal 707.

In the above description, an output from each delta sigma modulator is binary. However, it is contemplated that the output may have more values in order to reduce quantization noise. However, in this case, the non-linearity of the succeeding amplifier creates a problem. Thus, original first and second data are distorted in advance. That is, the first and second data are distorted in advance (that is predistorted) in consideration of the non-linearity of the amplifier so that the signals outputted from the amplifier match the original undistorted first and second data. Then, the distorted data has only to correspond to 0, a, and 2a in connection with an envelope. This reduces the amount of memory required.

Specifically, in the prior art, the amplitude $(I^2+Q^2)^{1/2}$ has very many possible values and thus requires a very large memory capacity. However, with the above method, the data has only to correspond to, for example, 0, a, and 2a. It is thus possible to sharply reduce the amount of memory required while suppressing the non-linear distortion.

Figure 21:
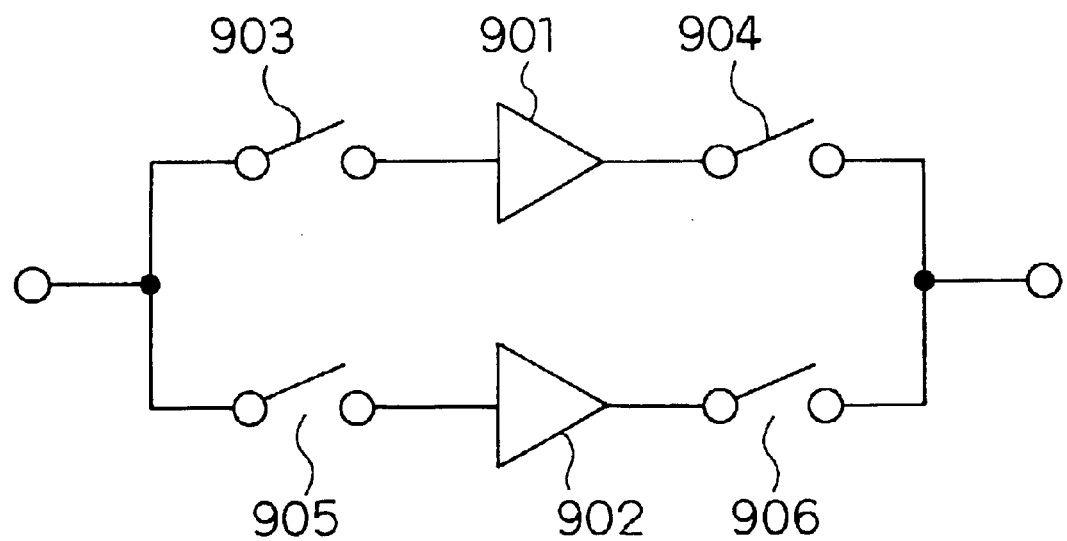
FIG. 21(A) is a diagram showing an example of some components of the transmitter according to Embodiment 2 of the present invention.
FIG. 21(B) is a diagram showing operations of the circuit showing in FIG. 21(A)
Figure 21:
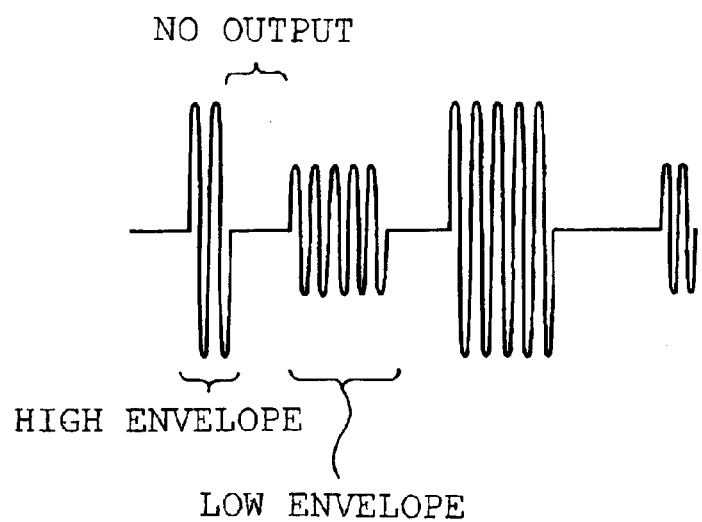

Further, in another configuration, if an output from each delta sigma modulator has more than two values, a plurality of amplifiers are connected in parallel as shown in FIG. 21(A). Then, at least one amplifier is selected (turned on) by turning on or off switches 903 to 906 connected to the respective amplifiers so that each switch is located preceding or succeeding the corresponding amplifier. Thus, the envelope is varied. For example, for no outputs, the switches 903 to 906 are turned off to unselect the amplifiers 901 and 902. To output a low envelope, the switches 903 and 904 are turned on while the switches 905 and 906 are turned off so as to select the amplifier 901 while unselecting the amplifier 902. To output a high envelope, the switches 905 and 906 are turned on while the switches 903 and 904 are turned off so as to select the amplifier 902 while unselecting the amplifier 901 (see FIG. 21(B)).

Figure 32:
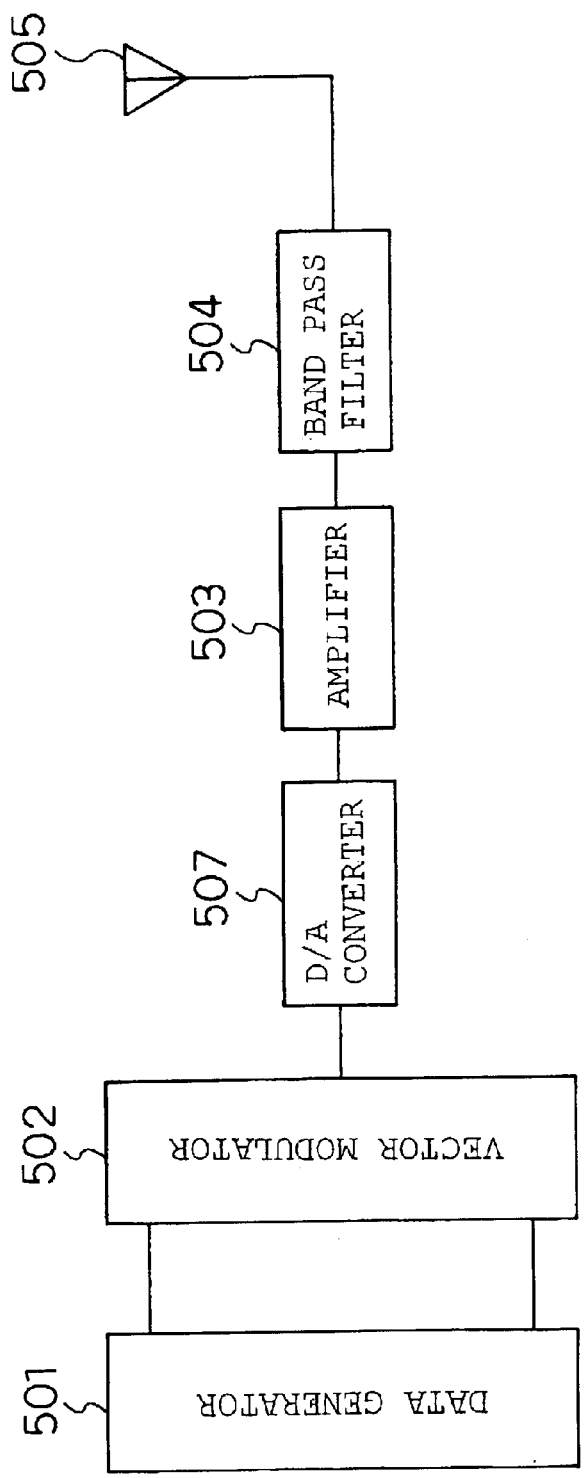
FIG. 32 is a block diagram showing a variation of the configuration of the transmitter according to Embodiment 2 of the present invention.

In the above description, the functions of the components ending with the each vector modulator can be implemented using digital signal processing in place of analog signal processing. For example, by carrying out the functions of the components ending with the each vector modulator using digital signal processing, no analog circuits are required, thus simplifying the configuration. An efficient transmitter with a simple configuration can be provided by executing the processes ending with an output from the vector modulator using digital signal processing and connecting an analog circuit to the amplifier 503 so that the former follows the latter as shown in FIG. 32.

Figure 22:
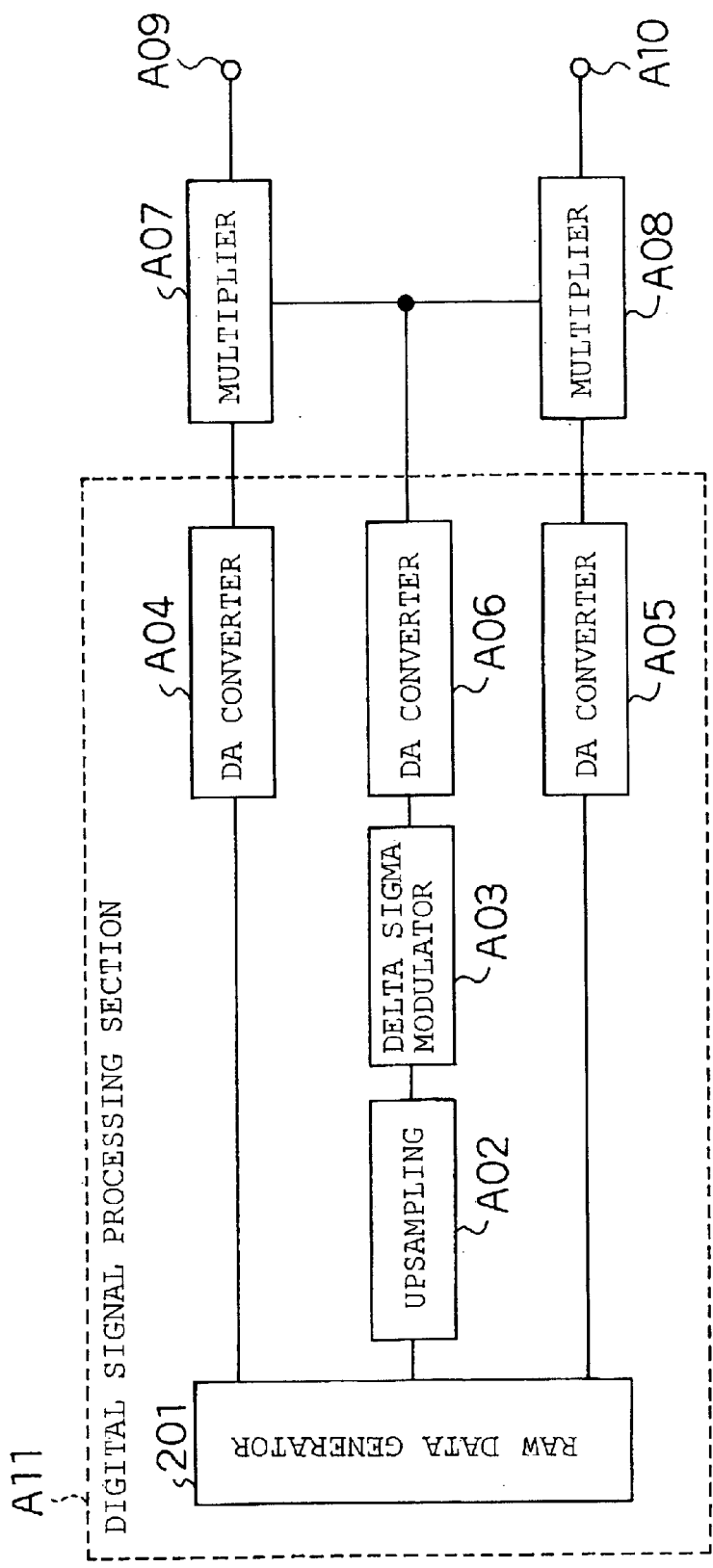
FIG. 22 is a block diagram showing a configuration of another example of the data generator according to Embodiment 1 of the present invention.

Further, the clock frequency of the delta sigma modulator must be much higher than its symbol frequency. For example, this clock frequency is 128 times of the symbol frequency. As a result, the D/A converter must operate at a high speed. When all the processes ending with an output from the vector modulator are executed digitally before a D/A conversion, the D/A converter must be able to achieve a high speed and a high vertical resolution. Consequently, this method is difficult to actualize or even if it can be actualized at all, much power is consumed. Thus, in this case, the arrangement ending with an output from the vector modulator may be as shown in FIG. 22.

Specifically, a multiplier A07 (first multiplying means) is connected to a normalized I data output of the raw data generator 201 via a D/A converter A04 (first D/A converter according to the present invention). Further, a multiplier A08 (second multiplying means) is connected to a normalized Q data output of the raw data generator 201 via a D/A converter A05 (second D/A converter according to the present invention). Upsampling means A02 is connected to an output of the raw data generator 201 for the amplitude component of a quadrature signal. A delta sigma modulator A03 is connected to an output of the upsampling means A02.

A D/A converter A06 (third D/A converter according to the present invention) is connected to an output of the delta sigma modulator A03. An output of the D/A converter A06 is connected to inputs of the multipliers A07 and A08.

Here, the D/A converters A04 and A05 must be able to achieve a high vertical resolution but need not operate at a high speed. On the other hand, the D/A converter A06 must operate at a high speed but need not be able to achieve a high vertical resolution. With this arrangement, a digital signal processing section A11 (the arrangement ending with inputs to the multipliers A07 and A08) as a whole can achieve a required high speed and high vertical resolution.

If the speed and vertical resolution of the D/A converter are surplus to some degree, the transmitter may be configured so that the D/A converters are connected to the outputs of the data generator configured as shown in FIGS. 10 to 12 (that is, a fourth D/A converter is connected to the first data output, and a fifth D/A converter is connected to the second data output). With this arrangement, an efficient transmitter with a simple configuration can be provided.

Further, in the transmitter described above, quantization noise may create a problem. Specifically, in the above description, when the first and second data are defined as I' and Q', respectively, I' and Q' contain quantization noise in addition to the desired signal obtained by delta-sigma modulating I and Q. If this quantization noise is removed using a band pass filter, a filter with a narrow band is required. Further, if a transmission frequency is variable, the pass band of the filter must be variable. Either of these arrangements is difficult to achieve with a minimum loss. Even if it can be achieved at all, the size of the circuit must be increased.

Figure 23:
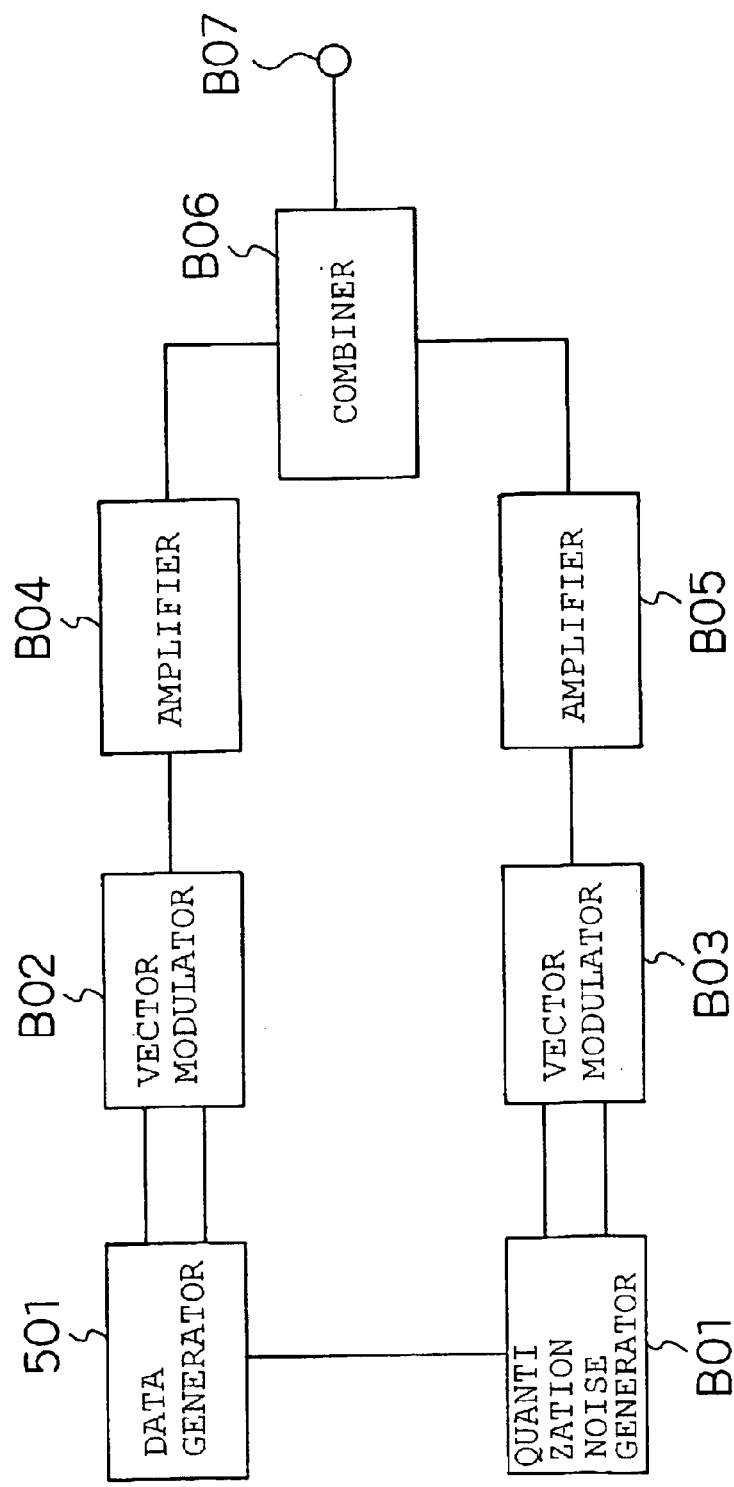
FIG. 23 is a block diagram showing a configuration of another example of the transmitter according to Embodiment 2 according to the present invention.

In this case, the transmitter shown in FIG. 23 is used. Specifically, a quantization noise generator B01 is connected to the data generator 501. The output of the data generator 501 connects to one input of a combiner B06 via a vector modulator B02 as an example of first vector modulating means according to the present invention and an amplifier B04 as an example of first amplifying means according to the present invention. An output of the quantization noise generator B01 connects to the other input of the combiner B06 via a vector modulator B03 as an example of fourth vector modulating means according to the present invention and an amplifier B05 as an example of second amplifying means according to the present invention.

The quantization noise generator generates and outputs a difference between I' and I as first quantization noise data I" (that is, I"=I'−I) corresponding to quantization noise. Further, it generates and outputs a difference between Q' and Q as second quantization noise data Q" (that is, Q"=Q'−Q) corresponding to quantization noise. Signals modulated using the data I" and Q" are combined in opposite phases with a signal modulated using the data I' and Q' (or the former signals are combined by adding minus signs to them with their phases remaining unchanged). This removes quantization noise. In the transmitter in FIG. 23, the data generator shown in FIG. 22 maybe used in place of the data generator 501. The opposite phase may correspond to a phase difference of just 180° but may also correspond to a phase difference between about 170 and 190° or between about 160 and 200°. In this case, effects similar to those described above can be produced.

However, it is practically difficult to remove quantization noise over a wide range using the above method alone. Accordingly, the quantization noise is canceled in a predetermined band as described above. A band pass filter is used to remove the quantization noise remaining outside the predetermined band. This band pass filter need not particularly have a steep characteristic (signals in the vicinity need not be suppressed).

Figure 33:
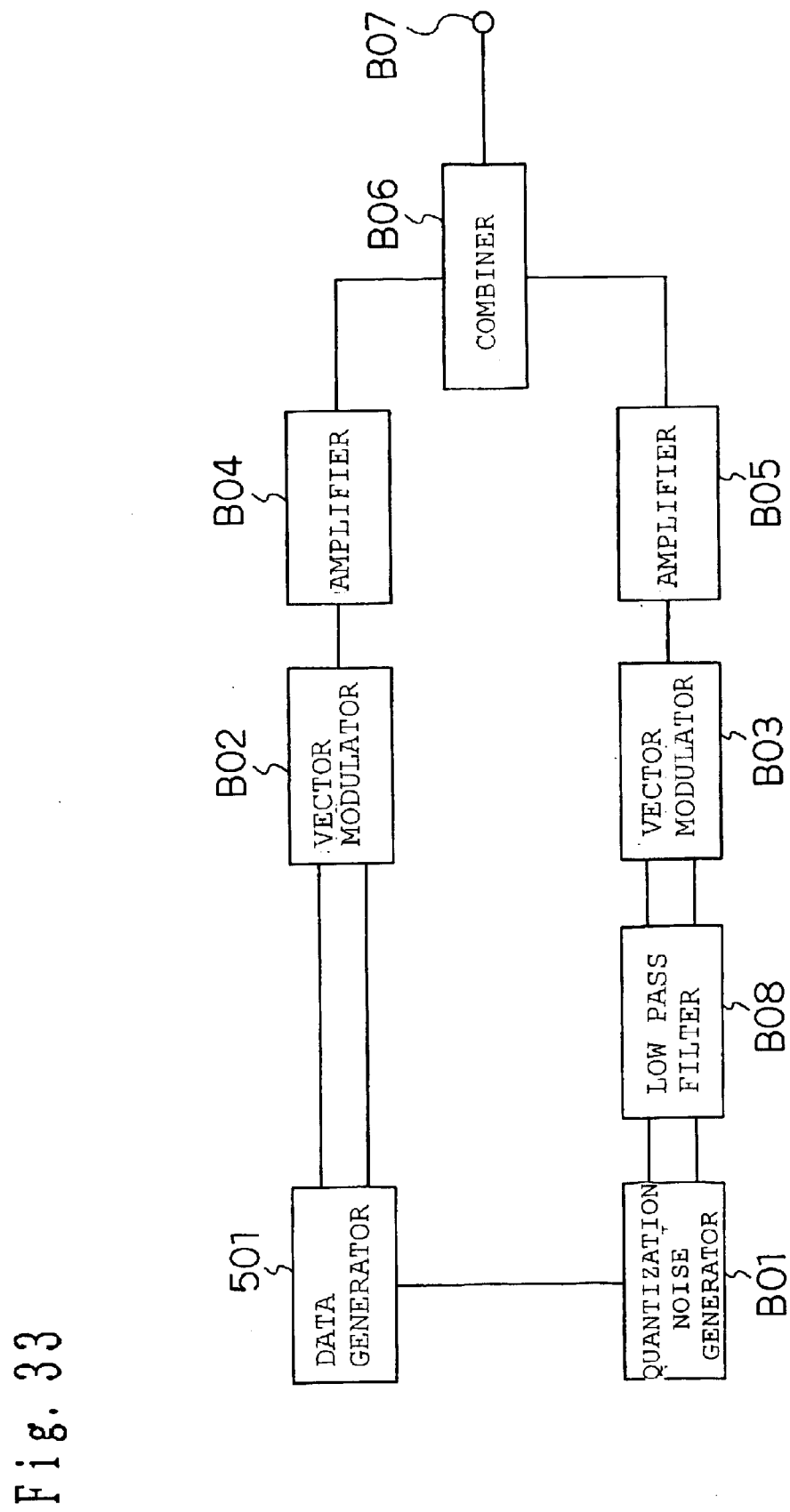
FIG. 33 is a block diagram showing a variation of the configuration of the transmitter according to Embodiment 2 of the present invention.

Further, it is contemplated that before vector modulation, unwanted signals may be removed from base band data using the low pass filter B08 as shown in FIG. 33. This arrangement avoids large power inputting to the amplifier B05 over a wide range of frequency. It is thus possible to improve total efficiency.

Figure 24:
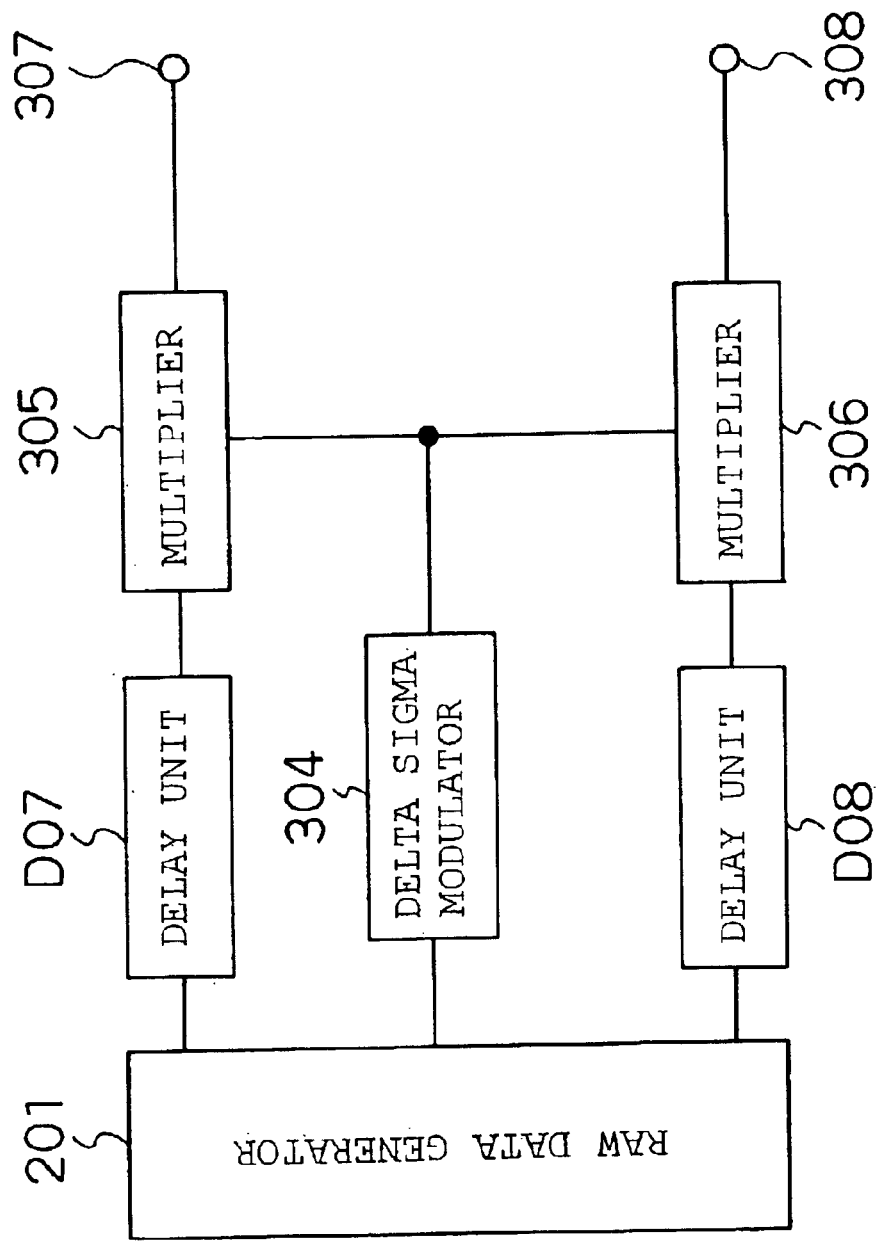
FIG. 24 is a block diagram showing a configuration of another example of the data generator according to Embodiment 1 of the present invention.
Figure 25:
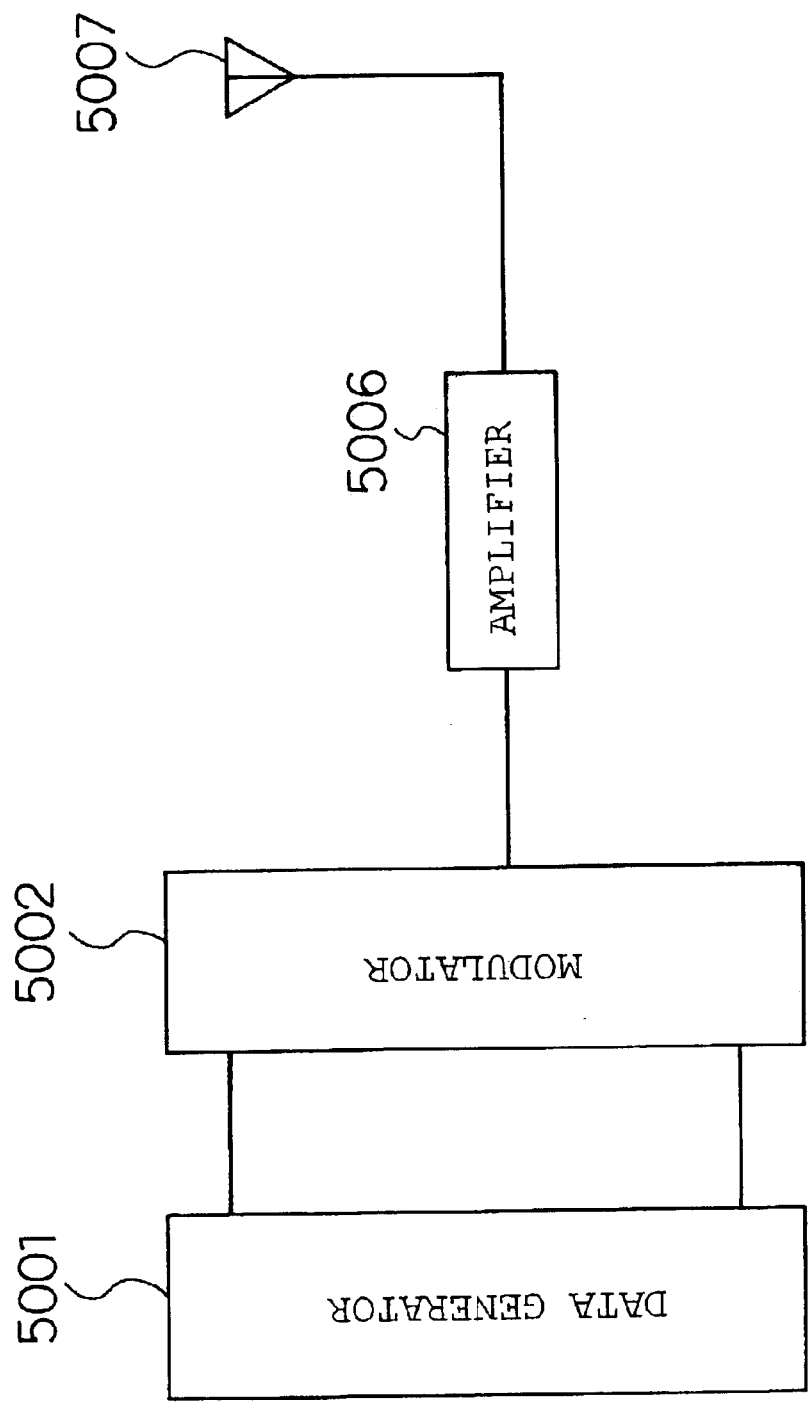
FIG. 25 is a block diagram showing an example of a configuration of a conventional transmitter.

Further, in the above description, a possible delay in each delta sigma modulator is not taken into account. In particular, when a higher-order delta sigma modulator is used, the delay may create a problem. In this case, the data generator may be configured as shown in FIG. 24. That is, the data generator shown in FIG. 24 is the data generator shown in FIG. 10 wherein a delay unit D07 as an example of first delay means according to the present invention is interposed between a normalized I signal output of the raw data generator 201 and the multiplier 305 and wherein a delay unit D08 as an example of second delay means according to the present invention is interposed between a normalized Q signal output of the raw data generator 201 and the multiplier 306. The amount of delay in the delay unit D07 and delay unit D08 corresponds to the amount of delay in the delta sigma modulator.

With this arrangement, signals inputted to the multipliers 305 and 306 are delayed in association with the delay in the delta sigma modulator 304. Consequently, the delay in the delta sigma modulator 304 can be corrected. An arrangement using a delay circuit can also be used in other data generators. For example, if in the data generator shown in FIG. 11, the delta sigma modulator 304 is corrected, third and fourth delay means such as those described above may be connected between an I signal output of the raw data generator 301 and the divider 302 and between a Q signal output of the raw data generator 301 and the divider 303, respectively.

Figure 26:
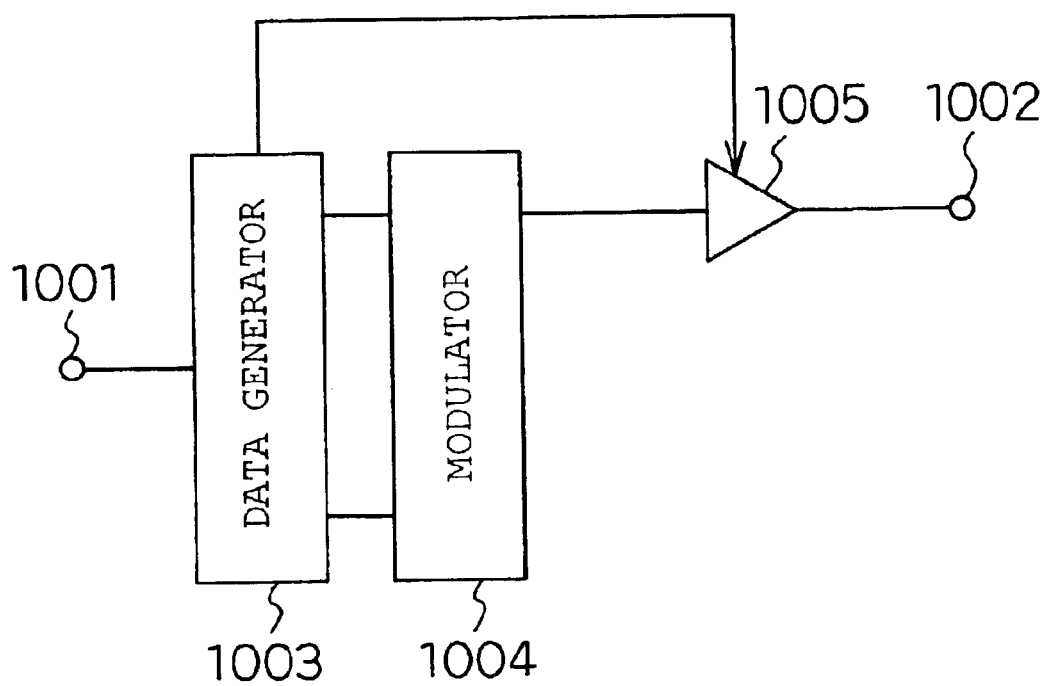
FIG. 26 is a block diagram showing a variation of the transmitter according to Embodiment 2 of the present invention.

Further, in the above description, the normalized I and Q data are delta-sigma-modulated into first and second data, respectively, before being subjected to vector modulation or the like. However, these data may be subjected to angle modulation or the like before being delta-sigma-modulated. FIG. 26 shows such an example. A data generator 1003 outputs normalized I data, normalized Q data, and a delta-sigma-modulated amplitude signal. The normalized I and Q data are inputted to a modulator 1004 for quadrature modulation. A signal outputted from the modulator 1004 is inputted to an amplitude modulator 1005. The amplitude modulator 1005 then amplitude-modulates this signal using the delta-sigma-modulated amplitude signal.

Figure 27:
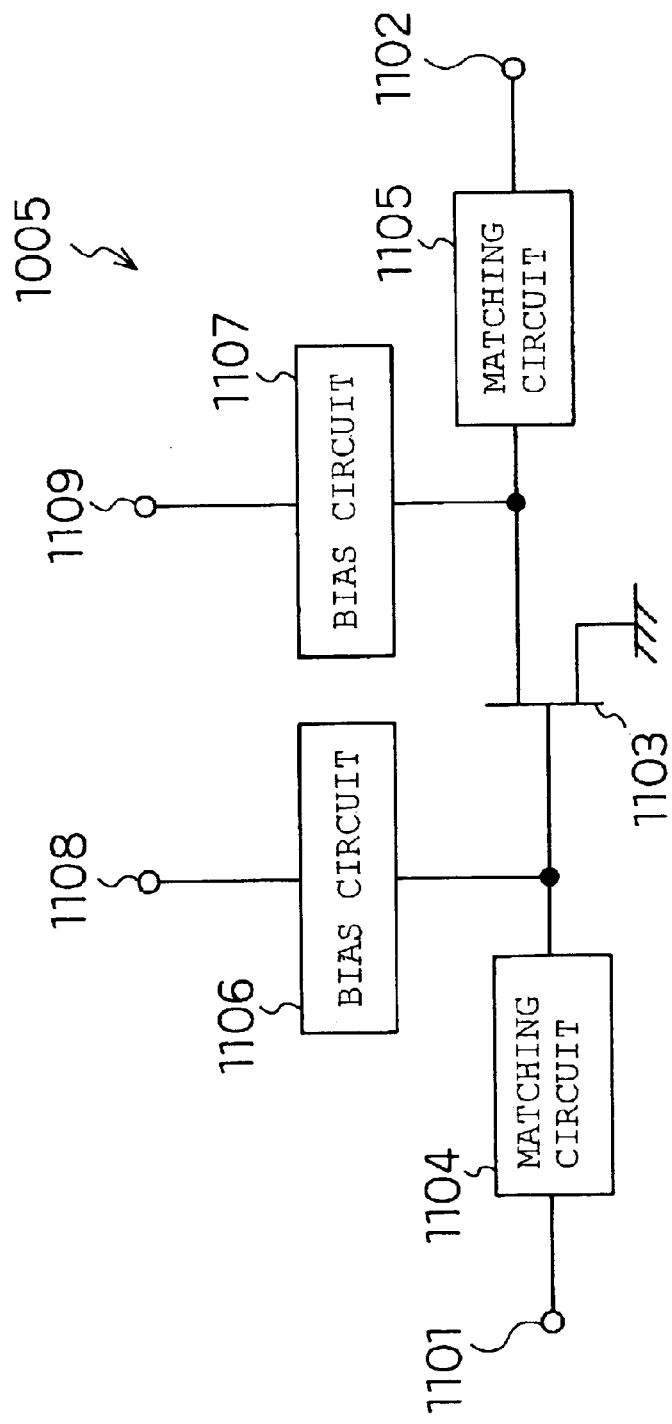
FIG. 27 is a block diagram showing an example of amplitude modulating means used in the transmitter shown in FIG. 26.

FIG. 27 shows a specific example of a configuration of the amplitude modulator 1005. Reference numerals 1104 and 1105 denote matching circuits. Reference numerals 1106 and 1107 denote bias circuits. An angle-modulated signal is inputted to an input terminal 1101. A delta-sigma-modulated amplitude signal is inputted to either a gate voltage supply terminal 1108 or a drain voltage supply terminal 1109. By thus controlling the magnitude of a gate or drain voltage at a transistor 1103, it is possible to control the magnitude of an envelope outputted from an output terminal 1102. If an input has three or more values, the amplitude modulators 1005 maybe configured as shown in FIG. 21(A). Even with these arrangements and operations, effects similar to those described above can be produced.

Figure 28:
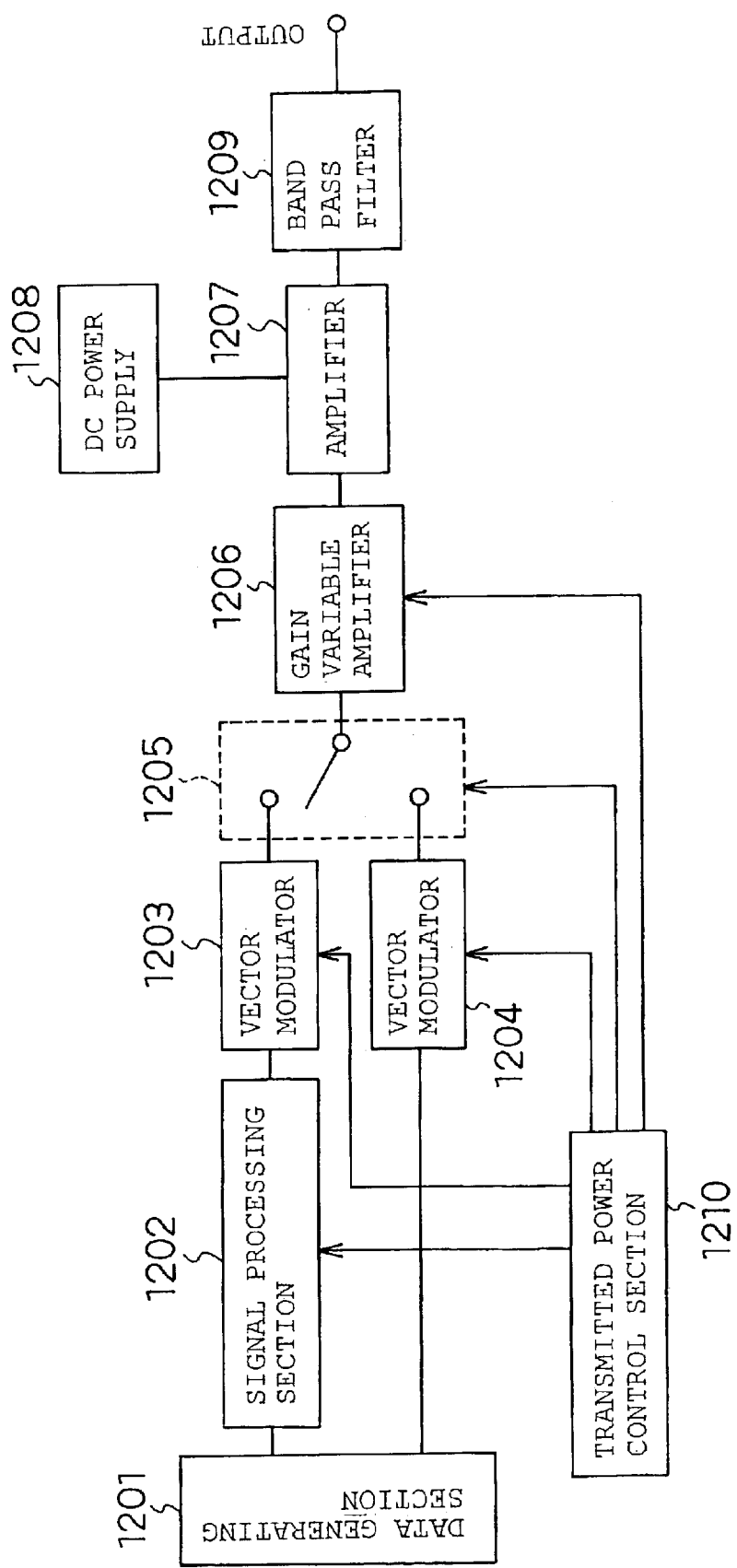
FIG. 28 is a block diagram showing a variation of the transmitter according to Embodiment 2 of the present invention.

Further, in the transmitter according to the present invention described above, it is contemplated that the vector modulating means may be changed in accordance with the intensity of power transmitted by the transmitter. FIG. 28 shows a configuration in this case.

A data generating section 1201 outputs an I signal, a Q signal, and their amplitude components to both a signal processing section 1202 and a vector modulator 1204. The signal processing section 1202 performs operations similar to those described in Embodiment 1 to generate first and second data from the inputted I and Q signals and their amplitude components. The first and second data outputted by the signal processing section 1202 are angle-modulated by a vector modulator 1203. On the other hand, the I and Q signals outputted from the data generating section 1201 are vector-modulated by the vector modulator 1204.

In this case, a transmitted power control section 1210 controls a switch 1205 to select the vector modulator 1203 when a transmitted signal outputted by the transmitter according to the present invention has an intensity equal to or larger than a predetermined value. The transmitted power control section 1210 controls the switch 1205 to select the vector modulator 1204 when a transmitted signal outputted by the transmitter according to the present invention has an intensity smaller than the predetermined value. A selected modulation signal is outputted as a transmitted signal via a gain variable amplifier 1206, an amplifier 1207, and a band pass filter 1209. The transmitted signal can be efficiently outputted by thus changing the vector modulators 1203 and 1204 on the basis of the magnitude of the transmitted power. That is, when the transmitted power is less than the predetermined amount, the signal processing section 1202 including the delta sigma modulating means need not be operated. Consequently, power consumption can be reduced.

In the example shown in FIG. 28, the data generating section 1201 and the signal processing section 1202 correspond to the data generator according to the present invention. The vector modulator 1203 corresponds to the first vector modulating means according to the present invention. The vector modulator 1204 corresponds to the second vector modulating means according to the present invention. Here, the vector modulators 1203 and 1204 are quadrature or polar modulators.

Further, in the example shown in FIG. 28, the transmitted power control section 1210 controllably turns on and off operations of each component. It turns off a power supply to a line that is not used.

Figure 29:
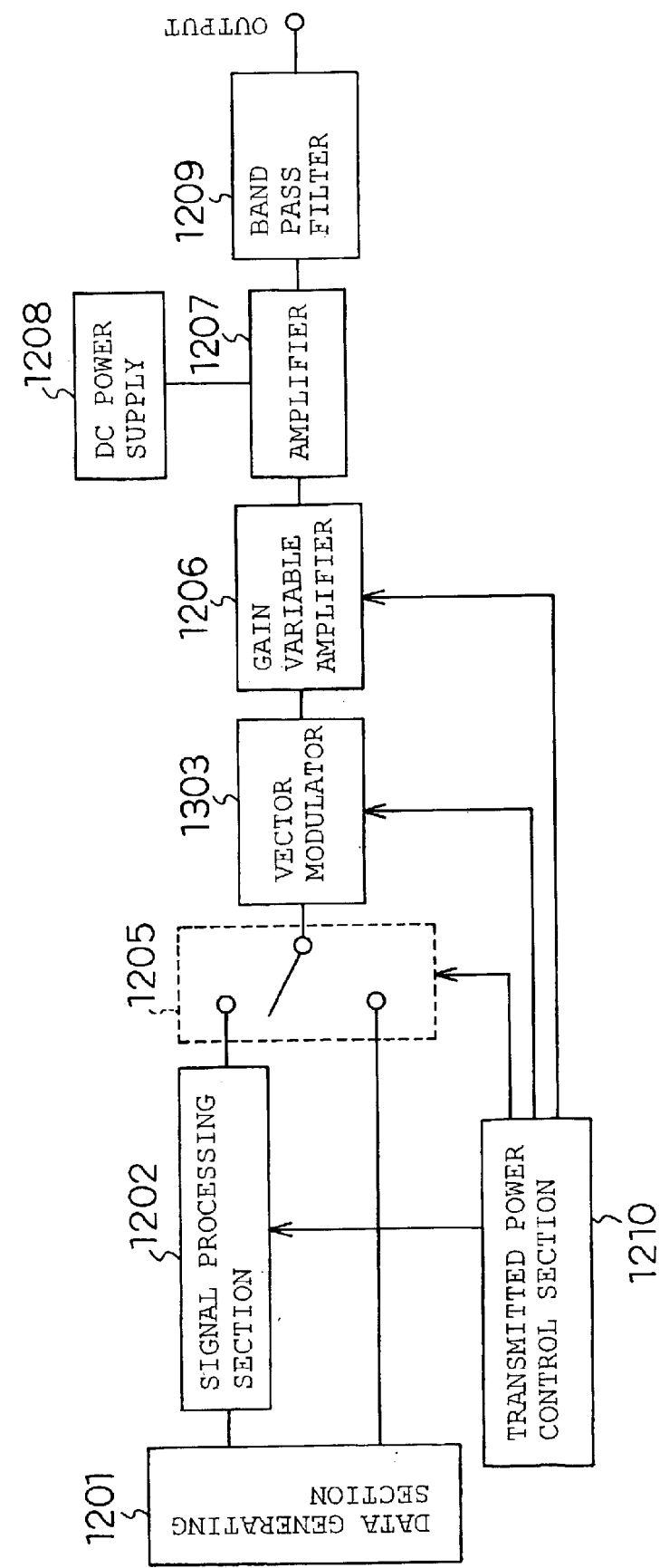
FIG. 29 is a block diagram showing another variation of the transmitter according to Embodiment 2 of the present invention.

Furthermore, in the example shown in FIG. 28, it is contemplated that the vector modulator 1203 and the vector modulator 1204 may be replaced with a single vector modulator. FIG. 29 shows an example of a configuration in this case. A vector modulator 1303 corresponds to the third vector modulating means according to the present invention.

In the above description, the converting means according to the present invention corresponds to each delta sigma modulator. However, the converting means according to the present invention is not limited to the delta sigma modulator. It may be a delta modulator or the like which can capable of conversions into analog signals with discrete envelopes. Furthermore, the converting means according to the present invention may be capable of converting a signal into a signal with a resolution lower than that of the amplitude component of the original signal. In this case, effects similar to those described above can be produced.

Moreover, the vector modulation in the above description includes quadrature modulation, polar modulation, amplitude modulation, angle modulation, and frequency modulation.

According to the present invention, it is possible to provide a data generator and a data generating method which serve to implement an efficient transmitter, as well as a transmitter utilizing this data generator.

What is claimed is:

1. A data generating method comprising:
    receiving an input signal to generate, from said signal, a quadrature signal composed of an I signal and a Q signal;
    converting an amplitude component of said quadrature signal into a signal of a resolution lower than a resolution of said amplitude component;
    dividing said I signal by the amplitude component of said quadrature signal to obtain normalized I data, multiplying said normalized I data by said converted signal to obtain first data, and outputting the first data; and
    dividing said Q signal by the amplitude component of said quadrature signal to obtain normalized Q data, multiplying said normalized Q data by said converted signal to obtain second data, and outputting the second data.

2. A data generator comprising:
    raw data generating means of generating, from an inputted signal, an I signal and a Q signal which are orthogonal to each other as well as an amplitude component of a quadrature signal composed of said I signal and said Q signal;
    converting means of converting said amplitude component into a signal of a resolution lower than a resolution of said amplitude component;
    first multiplying means of multiplying normalized I data obtained by dividing said I signal by the amplitude component, by said converted signal to obtain first data, and outputting the first data; and
    second multiplying means of multiplying normalized Q data obtained by dividing said Q signal by the amplitude component, by said converted signal to obtain second data, and outputting the second data.

3. The data generator according to claim 2, wherein said convening means is delta sigma modulating means.

4. The data generator according to claim 3, wherein said raw data generating means outputs said I signal, said Q signal, and said amplitude component,
    wherein first dividing means connected to an output of said raw data generating means which outputs said amplitude component is connected to an output of said raw data generating means which outputs said I signal, and said first dividing means outputs said normalized I data by dividing said I signal by said amplitude component,
    wherein second dividing means connected to the output of said raw data generating means which outputs said amplitude component is connected to an output of said raw data generating means which outputs said Q signal, and said second dividing means outputs said normalized Q data by dividing said Q signal by said amplitude component,
    wherein said delta sigma modulating means is connected to the output of said raw data generating means which outputs the amplitude component,
    wherein said delta sigma modulating means outputs a signal obtained by delta-sigma-modulating said amplitude signal,
    wherein first multiplying means connected to an output of said delta sigma modulating means is connected to an output of said first dividing means, and said first multiplying means multiplies said normalized I data by the signal obtained by delta-sigma-modulating said amplitude signal, to obtain first data, and outputs the first data, and wherein second multiplying means connected to the output of said delta sigma modulating means is connected to an output of said second dividing means, and said second multiplying means multiplies said normalized Q data by the signal obtained by delta-sigma-modulating said amplitude signal, to obtain second data, and outputs the second data.

5. The data generator according to claim 2, wherein said raw data generating means outputs the normalized I data obtained by dividing said I signal by the amplitude component of said quadrature signal, the normalized Q data obtained by dividing said Q signal by the amplitude component of said quadrature signal, and the amplitude component of said quadrature signal.

6. The data generator according to claim 5, wherein said converting means is delta sigma modulating means.

7. The data generator according to claim 2 or 5, further comprising a first D/A converter and a second D/A converter which subject the first data and second data, respectively, outputted by said data generator, to D/A conversion.

8. The data generator according to claim 6, further comprising:

a first D/A converter connected to the output of said raw data generating means which outputs the normalized I data, of converting said normalized I data into analog data;

a second D/A converter connected to the output of said raw data generating means which outputs the normalized Q data, of converting said normalized Q data into analog data;

upsampling means connected to the output of said raw data generating means of upsampling the amplitude component of said quadrature signal; and a third D/A converter connected to the output of said delta sigma modulating means, of converting said delta-sigma-modulated signal, into analog signal, and wherein said delta sigma modulating means delta-sigma-modulates said upsampled signal, wherein said first multiplying means is connected to an output of said first D/A converter and an output of said third D/A converter to multiply said normalized I data converted into analog data by said delta-sigma-modulated signal converted into analog signal and then to output a result of the multiplication, wherein said second multiplying means is connected to an output of said second D/A converter and an output of said third D/A converter to multiply said normalized Q data converted into analog data by said delta-sigma-modulated signal converted into analog signal and then to output a result of the multiplication, and wherein said first D/A converter and said second D/A converter have a higher vertical resolution than said third D/A converter, and said third D/A converter operates at a higher speed than said first D/A converter and said second D/A converter.

9. The data generator according to claim 2, further comprising first delay means of delaying said I signal and second delay means of delaying said Q signal.

10. The data generator according to claim 2, further comprising third delay means of delaying said normalized I signal and fourth delay means of delaying said normalized Q signal.

11. The data generator according to claim 3 or 6, wherein a low pass filter having a cutoff frequency higher than the half of a clock frequency of said delta sigma modulating means is connected to each of the outputs of said first multiplying means and said second multiplying means, to filter said first data and said second data.

12. The data generator according to claim 3 or 6, wherein said delta-sigma-modulated signal is composed of data sequence of real numbers with two values having the same magnitude and different signs.

13. The data generator according to claim 3 or 6, wherein said delta-sigma-modulated signal is composed of two values including 0 and a real number other than 0.

14. A data generator comprising:

raw data generating means of generating, from an inputted signal, an I signal and a Q signal which are orthogonal to each other as well as an amplitude component of a quadrature signal composed of said I signal and said Q signal, and outputting normalized I data obtained by dividing said I signal by the amplitude component of said quadrature signal, normalized Q data obtained by dividing said Q signal by the amplitude component of said quadrature signal, and a signal which is obtained by converting a signal obtained from the amplitude component of said quadrature signal and which has a lower resolution than said amplitude component;

angle modulating means of angle-modulating said normalized I data and said normalized Q data to output said angle-modulated signal; and amplitude modulating means of amplitude-modulating the angle-modulated signal outputted from said angle modulating means, using a signal obtained by converting amplitude data outputted by said raw data generating means.

15. A transmitter comprising:

a data generator according to claim 2 or 5; and vector modulating means of vector-modulating first data and second data outputted by said data generator.

16. The transmitter according to claim 15, wherein amplifying means is connected to an output of said modulating means, of amplifying said modulated signal, wherein band pass means is connected to an output of said amplifying means, of passing a particular band of said amplified signal, and wherein an antenna is connected to an output of said band pass means, for transmitting said passed band of the signal.

17. The transmitter according to claim 16, wherein an isolator is provided between said amplifying means and said band pass means.

18. A transmitter comprising:

a data generator according to claim 2 or 5;

first vector modulating means of vector-modulating said first data and said second data;

second vector modulating means of vector-modulating said I signal and said Q signal; and amplifying means of amplifying said vector-modulated signal, and wherein when the transmitted signal has an intensity larger than a predetermined amount, the signal vector-modulated by said first vector modulating means is inputted to said amplifying means for amplification, and when the transmitted signal has an intensity smaller than the predetermined amount, the signal vector-modulated by said second vector modulating means is inputted to said amplifying means for amplification.

19. A transmitter comprising:

a data generator according to claim 2 or 5;

vector modulating means of for vector-modulating said first data and said second data or said I signal and said Q signal; and amplifying means of amplifying the signal vector-modulated by said vector modulating means, and wherein when the transmitted signal has an intensity larger than a predetermined amount, said vector modulating means modulates said first data and said second data, and when the transmitted signal has an intensity smaller than the predetermined amount, said vector modulating means modulates said I signal and said Q signal.

20. A transmitter comprising a data generator according to claim 2 or 5; and modulating means of modulating first data and second data outputted from said data generator, wherein amplifying means is connected to an output of said modulating means, of amplifying said modulated signal, wherein band pass means is connected to an output of said amplifying means, of passing a particular band of said amplified signal, and wherein an antenna is connected to an output of said band pass means, for transmitting said passed band of the signal.

21. The transmitter according to claim 20, wherein said converting means is delta sigma modulating means, a signal outputted from said delta sigma modulating means has multiple values, and a predistorted signal to compensate for non-linearity of said amplifying means is inputted to said amplifying means.

22. The transmitter according to claim 20, wherein a signal outputted from said delta sigma modulating means has multiple values, said amplifying means is composed of a plurality of amplifiers connected in parallel, and at least one of said plurality of amplifiers is selected in accordance with an envelope of the signal outputted from said delta sigma modulating means.

23. The transmitter according to claim 15, wherein a process ending with an output from said modulating means comprises a digital signal process.

24. A transmitter comprising:

a data generator according to claim 2 or 5;

first vector modulating means connected to an output of said data generator, of vector-modulating first data and second data outputted from said data generator;

first amplifying means connected to an output of said first modulating means, of amplifying a signal outputted from said first modulating means;

quantization noise generating means connected to said data generator, of outputting first quantization noise data generated by subtracting said I signal from said first data and second quantization noise data generated by subtracting said Q signal from said second data;

fourth vector modulating means connected to an output of said quantization noise generating means, of vector-modulating said first quantization noise data and said second quantization noise data;

second amplifying means connected to an output of said fourth vector modulating means, of amplifying a signal outputted from said fourth vector modulating means; and combining means connected to an output of said first amplifying means and to an output of said second amplifying means, of combining the signal outputted from said first amplifying means and the signal outputted from said second amplifying means in substantially same amplitude and opposite phases, to cancel a quantization noise component.

25. The transmitter according to claim 24, wherein a low pass filter is connected to an output of said quantization noise generating means.

\* \* \* \* \*